US012610511B2

(12) United States Patent
Isobata et al.

(10) Patent No.: US 12,610,511 B2
(45) Date of Patent: Apr. 21, 2026

(54) COMPONENT MOUNTING DEVICE AND COMPONENT MOUNTING METHOD

(71) Applicant: Panasonic Intellectual Property Management Co., Ltd., Osaka (JP)

(72) Inventors: Yoshinori Isobata, Fukuoka (JP); Kunimi Tsuzurugi, Fukuoka (JP); Tatsuo Yamamura, Fukuoka (JP); Kyourei Ri, Fukuoka (JP); Chikara Takata, Fukuoka (JP); Atuyuki Horie, Fukuoka (JP); Kazunari Mishima, Fukuoka (JP); Minoru Kitani, Fukuoka (JP); Kazunori Kanai, Fukuoka (JP); Yasuo Oku, Fukuoka (JP); Hiroaki Kato, Fukuoka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 738 days.

(21) Appl. No.: 17/999,409

(22) PCT Filed: May 20, 2021

(86) PCT No.: PCT/JP2021/019139
§ 371 (c)(1),
(2) Date: Nov. 21, 2022

(87) PCT Pub. No.: WO2021/241389
PCT Pub. Date: Dec. 2, 2021

(65) Prior Publication Data
US 2023/0200036 A1 Jun. 22, 2023

(30) Foreign Application Priority Data

May 29, 2020 (JP) ................................. 2020-093810
May 29, 2020 (JP) ................................. 2020-093811

(51) Int. Cl.
*H01F 7/06* (2006.01)
*H05K 13/04* (2006.01)
*H05K 13/08* (2006.01)

(52) U.S. Cl.
CPC ..... *H05K 13/0452* (2013.01); *H05K 13/0419* (2018.08); *H05K 13/086* (2018.08)

(58) Field of Classification Search
CPC ........... H05K 13/0417; H05K 13/0419; H05K 13/0452; H05K 13/086; H05K 13/0882
See application file for complete search history.

(56) References Cited

U.S. PATENT DOCUMENTS 10,271,469 B2 * 4/2019 Tanokuchi ......... H05K 13/0419
12,137,525 B2 * 11/2024 Maezono ............... H05K 13/02
(Continued)

FOREIGN PATENT DOCUMENTS

| CN | 108353527 A | 7/2018 |
| JP | 2011-023501 A | 2/2011 |
| JP | 6496908 B2 | 4/2019 |

OTHER PUBLICATIONS

International Search Report issued in Patent Application No. PCT/JP2021/019139 dated Jul. 20, 2021.
(Continued)

*Primary Examiner* — Paul D Kim
(74) *Attorney, Agent, or Firm* — McDonald Hopkins LLC

(57) ABSTRACT

The component mounting device includes a component supply part on which a component supply unit that supplies a component stored in a carrier tape is detachably mounted; a feeder information acquisition part that acquires feeder information including a type of the component supply unit mounted on the component supply part; a component mounting part that mounts the component supplied from the component supply unit onto a substrate; and a unit controller
(Continued)

that controls the component supply unit based on the feeder information.

8 Claims, 18 Drawing Sheets

(56)                    References Cited

U.S. PATENT DOCUMENTS

| | | | |
|---|---|---|---|
| 2013/0110464 A1* | 5/2013 | Ishida ................ | H05K 13/0812 |
| | | | 702/183 |
| 2018/0118387 A1* | 5/2018 | Eguchi ............... | B65H 19/1852 |
| 2018/0235120 A1* | 8/2018 | Hara .................... | H05K 1/0269 |
| 2018/0376635 A1 | 12/2018 | Iisaka et al. | |

OTHER PUBLICATIONS

English Translation of Chinese Search Report dated Jul. 25, 2024 for the related Chinese Patent Application No. 202180037799.X.

* cited by examiner

COMPONENT MOUNTING DEVICE AND COMPONENT MOUNTING METHOD

TECHNICAL FIELD

The present disclosure relates to a component mounting device and a component mounting method for mounting a component supplied from a component supply unit onto a substrate.

BACKGROUND ART

A component mounting device that mounts a component on a substrate to produce a mounting board includes a component supply unit that supplies a component stored in a carrier tape, and a mounting head that takes out a component from the component supply unit and mounts the component on the substrate. There is known a component supply unit that includes a connector for connecting an expansion unit, and is allowed to have a function extended by connection of the extension unit to the connector (e.g., Patent Literature 1).

The component supply unit (parts feeder) described in Patent Literature 1 includes a connector (extended communication port) which connects an extension unit such as an infrared communication adapter or a wireless communication adapter. By connecting the infrared communication adapter to the connector, the component supply unit is allowed to directly communicate with a handy scanner incorporating infrared communication, and to easily write data to a built-in controller in the component supply unit.

CITATION LIST

Patent Literature

Patent Literature 1: JP 2011-23501 A

SUMMARY OF THE INVENTION

However, in the related art including Patent Literature 1, although the function of the component supply unit is extended by connecting the extension unit, since control of a component mounting device main body is not changed, an extendable function is limited, resulting in leaving room for further improvement in order to support many functions.

Therefore, an object of the present disclosure is to provide a component mounting device capable of mounting a component on a substrate by a method that automatically matches a configuration of a component supply unit, and a component mounting method therefor.

A component mounting device of the present disclosure includes: a component supply part on which a component supply unit that supplies a component stored in a carrier tape is detachably mounted; a feeder information acquisition part that acquires feeder information including a type of the component supply unit mounted on the component supply unit; a mounting head that mounts the component supplied from the component supply unit onto a substrate; and a unit controller that controls the component supply unit based on the feeder information.

A component mounting method of the present disclosure is a component mounting method for mounting a component stored in a carrier tape on a substrate by a component supply part on which a component supply unit that supplies the component is detachably mounted, and by a mounting head that takes out the component from the component supply unit to mount the component on the substrate, the component mounting method including: a step of acquiring feeder information including a type of the component supply unit mounted on the component supply part; a step of taking out the component from the component supply unit and mounting the component on the substrate by the mounting head; and a step of controlling the component supply unit based on the feeder information.

Advantageous Effect of Invention

According to the present disclosure, a component can be mounted on a substrate by a method that automatically matches a configuration of a component supply unit.

DESCRIPTION OF EMBODIMENT

In the following, an embodiment of the present disclosure will be described in detail with reference to the drawings. Configuration, shape, and the like described below are examples for explanation, and can be appropriately changed according to specifications of a component mounting device, a component supply unit (component supply device), and the like.

Figure 1:
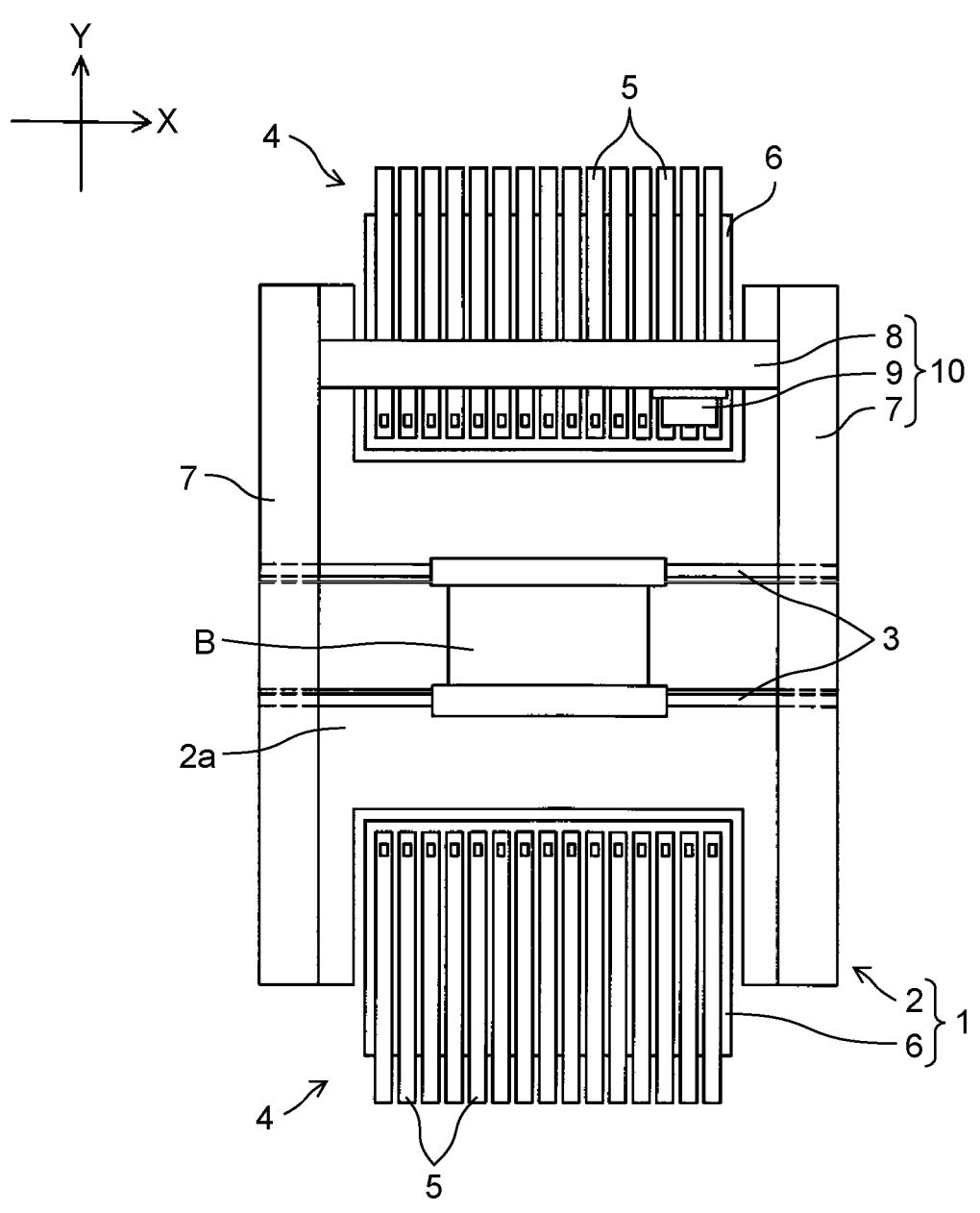
FIG. 1 is a plan view of a component mounting device according to an embodiment of the present disclosure.
Figure 2:
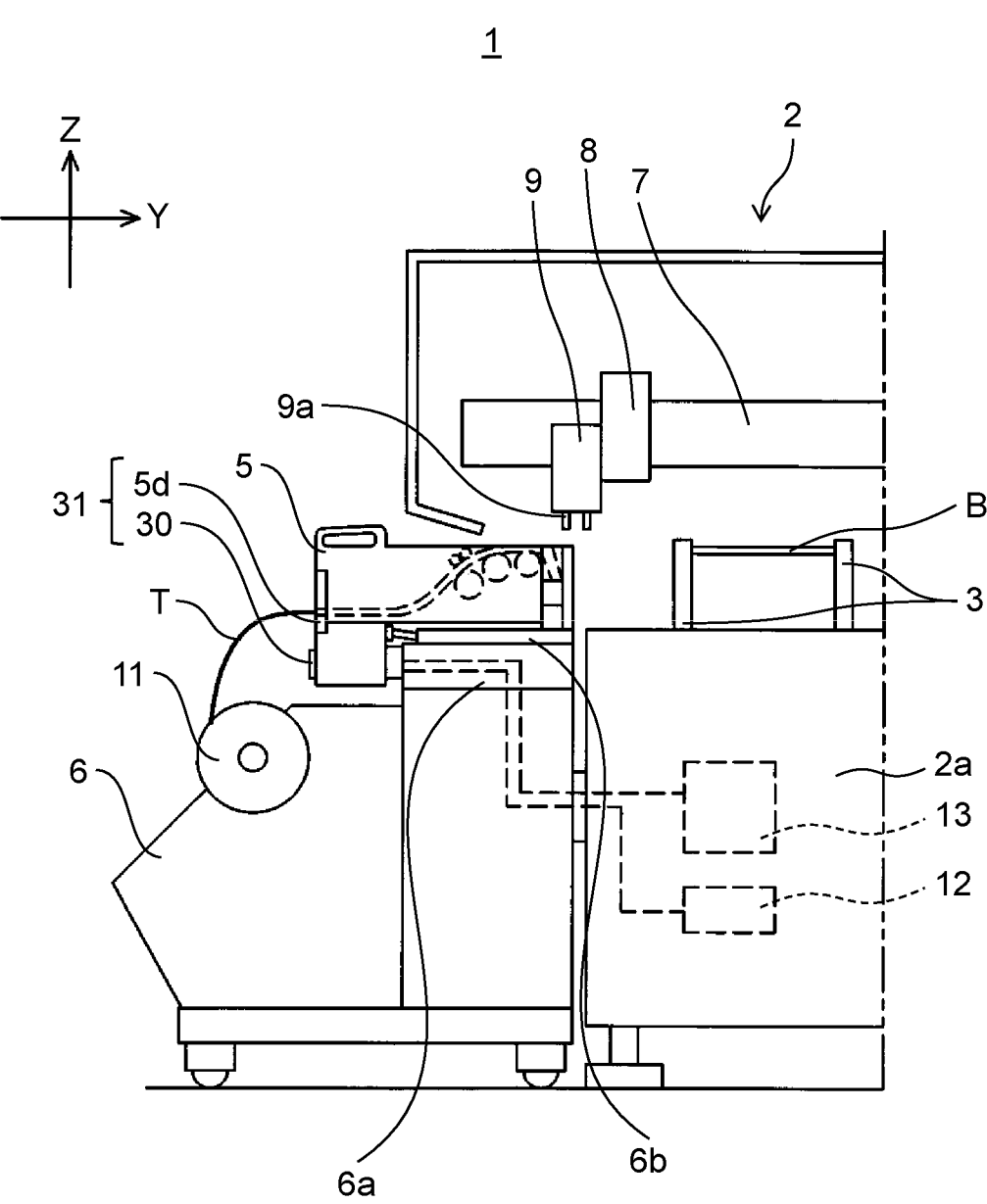
FIG. 2 is a partial cross-sectional view of the component mounting device according to the embodiment of the present disclosure.

Hereinafter, components corresponding to one another throughout all the drawings are denoted by the same reference numerals, and overlapped description thereof will be omitted. In FIG. 1 and a part of the following description, X direction (a left and right direction in FIG. 1) in a substrate conveyance direction and Y direction (an up and down direction in FIG. 1) orthogonal to the substrate conveyance direction are illustrated as two axial directions orthogonal to each other in a horizontal plane. In FIG. 2, Z direction (an up and down direction in FIG. 2) is illustrated as a height direction orthogonal to the horizontal plane. Z direction is an up and down direction or a direction orthogonal to the horizontal plane when the component mounting device is installed on the horizontal plane.

First, a configuration of component mounting device 1 will be described with reference to FIGS. 1 and 2. Component mounting device 1 has a function of mounting a component on substrate B. In FIG. 1, component mounting device 1 includes component mounting device main body part 2 including base 2*a* and carriage 6 attached to component mounting device main body part 2. At the center of base

2*a* of component mounting device main body part 2, substrate conveyance part 3 is installed in X direction. Substrate conveyance part 3 conveys substrate B carried in from an upstream side along X direction, and positions and holds substrate B at a position of mounting work to be performed by mounting head 9 which will be described below. Furthermore, substrate conveyance part 3 carries out substrate B on which component mounting work has been completed to a downstream side.

In FIGS. 1 and 2, carriage mounting parts 4 are provided on both sides of substrate conveyance part 3 of component mounting device main body part 2. Carriage 6 is attached to each carriage mounting part 4. A plurality of component supply units 5 are mounted on carriage 6 in parallel to each other in X direction. Component supply unit 5 pitch-feeds carrier tape T having a pocket for storing a component in a direction from the outside of carriage mounting part 4 toward substrate conveyance part 3 (tape feeding direction), thereby supplying the component to a component take-out position where mounting head 9 picks up the component. In other words, component supply unit 5 is a component supply device that supplies components stored in carrier tape T.

In FIG. 1, Y-axis tables 7 including a linear drive mechanism are disposed at both ends in X direction on an upper surface of base 2*a* of component mounting device main body part 2. Beam 8 similarly including a linear mechanism is coupled to Y-axis tables 7 so as to be movable in Y direction. Mounting head 9 is attached to beam 8 so as to be movable in X direction. Suction nozzle 9*a* (see FIG. 2) that holds a component by vacuum suction is attached to a lower end of mounting head 9.

Y-axis tables 7 and beam 8 move mounting head 9 in a horizontal direction (X direction, Y direction). Mounting head 9 sucks and picks up a component supplied from component supply unit 5 mounted on carriage 6 attached to carriage mounting part 4 by suction by suction nozzle 9*a*, and mounts the component at a mounting position of substrate B positioned on substrate conveyance part 3. By moving mounting head 9 holding a component, Y-axis tables 7, beam 8, and mounting head 9 constitute a component mounting part 10 that transfers and mounts the component on the substrate B.

In FIG. 2, component supply unit mounting part 6*a* is installed in an upper part of carriage 6. Component supply unit 5 is mounted on mounting base 6*b* formed on an upper surface of component supply unit mounting part 6*a*. Component reel 11 around which carrier tape T for storing a component is wound is held on a rear side of carriage 6 (the side opposite to component mounting device main body part 2). Component supply unit 5 conveys carrier tape T stored in component reel 11 in the tape feeding direction, and supplies a component to the component take-out position for mounting head 9.

Power source part 12 and mounting controller 13 are disposed in base 2*a* of component mounting device main body part 2. Component supply unit 5 mounted on carriage 6 is connected to power source part 12 and mounting controller 13 via component supply unit mounting part 6*a*. In other words, power is supplied from power source part 12 to component supply unit 5 mounted on component mounting device 1, and various commands are transmitted from mounting controller 13.

As described above, component supply unit mounting part 6*a* installed in carriage 6 attached to component mounting device main body part 2 of component mounting device 1 is component supply part C (see FIG. 11) to which the plurality of component supply units 5 for supplying components are detachably mounted. Component supply unit 5 mounted on component supply part C is a component supply device that supplies a component to component mounting device 1 that mounts a component on substrate B.

Next, a detailed configuration of component supply unit mounting part 6a (component supply part C) installed in carriage 6 will be described with reference to FIGS. 3 and 4. On a rear surface of component supply unit mounting part 6a, a plurality of mounting part connectors 14, mounting part air joints 15, and mounting part attitude stabilizing pins 16 are disposed corresponding to component supply units 5 mounted on mounting base 6b. Mounting part connector 14 is connected to first connector 22 provided in component supply unit 5. Mounting part air joint 15 is connected to air joint 23 provided in component supply unit 5. Mounting part attitude stabilizing pin 16 is inserted into pin insertion hole 24 formed in component supply unit 5.

On an upper surface of mounting base 6b formed on an upper portion of component supply unit mounting part 6a, a plurality of guides 17 extending in a mounting direction of component supply unit 5 and first position regulation part 18 are disposed corresponding to the plurality of component supply units 5 mounted on mounting base 6b. When component supply unit 5 is mounted on mounting base 6b, slider 25 provided in component supply unit 5 slides along guide 17. First position regulation part 18 regulates a position in a height direction of component supply unit 5 mounted on mounting base 6b.

Figure 3:
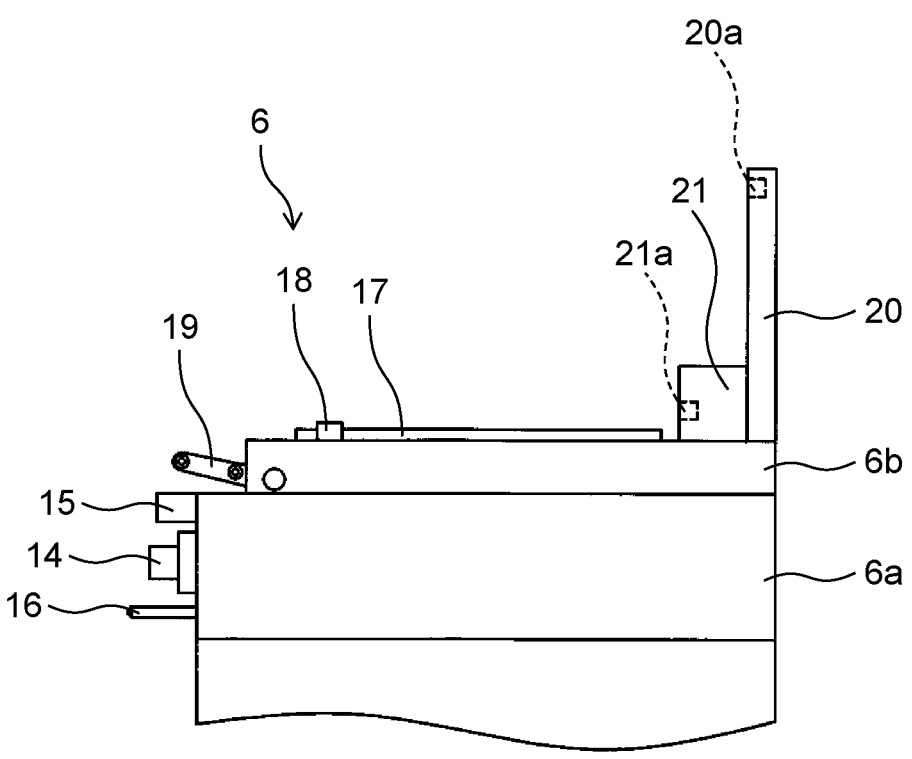
FIG. 3 is an explanatory view of a configuration of a component supply part on which the component supply unit (component supply device) is mounted according to the embodiment of the present disclosure.
Figure 4:
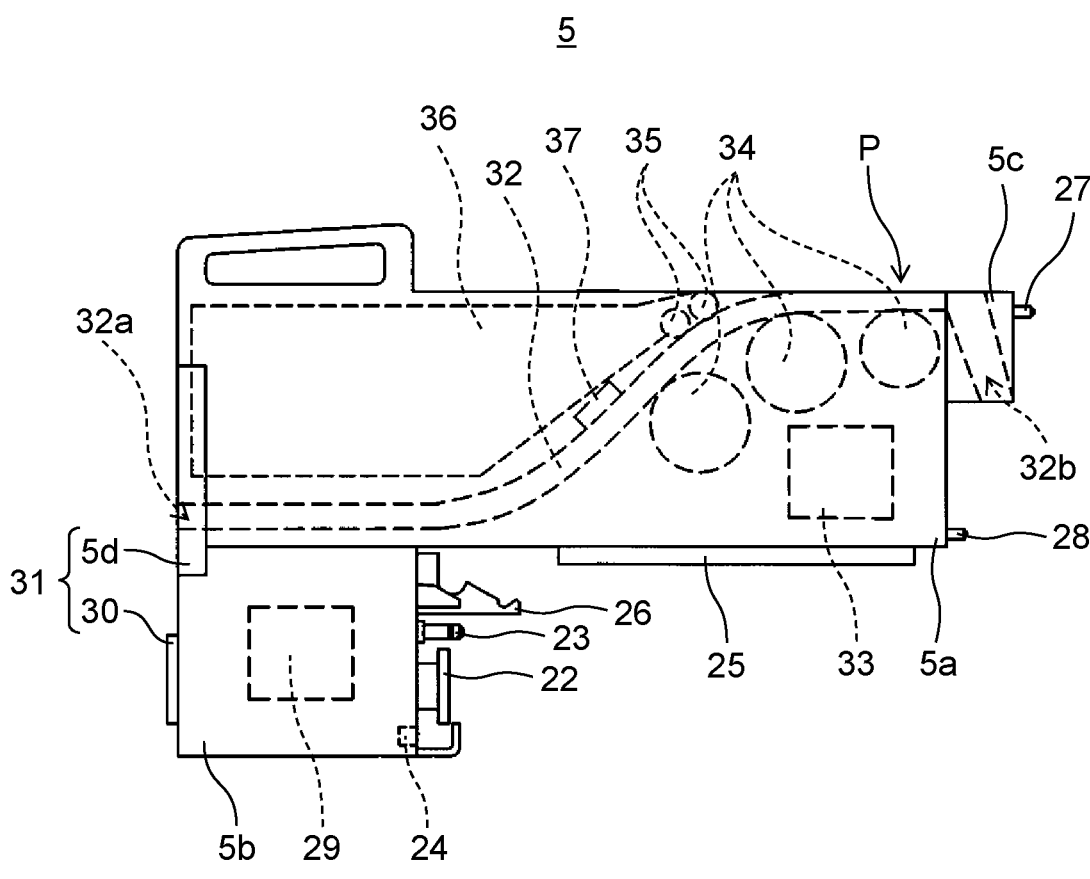
FIG. 4 is an explanatory view of a configuration of the component supply unit according to the embodiment of the present disclosure.

In FIGS. 3 and 4, a plurality of fixing arms 19 are disposed on a rear surface of mounting base 6b so as to correspond to the plurality of component supply units 5 mounted on mounting base 6b. Fixing arm 19 is engaged with hook 26 provided in component supply unit 5 to fix component supply unit 5 mounted on mounting base 6b. A plate-shaped attitude stabilizing member 20 is disposed upright on a front side of the upper surface of mounting base 6b. Second position regulation part 21 is disposed at the rear side of attitude stabilizing member 20 and between attitude stabilizing member 20 and guide 17.

A plurality of attitude stabilizing member insertion holes 20a are formed in an upper portion of a rear surface of attitude stabilizing member 20 so as to correspond to the plurality of component supply units 5 mounted on mounting base 6b. On a rear surface of second position regulation part 21, position regulation part insertion hole 21a is formed corresponding to component supply unit 5 mounted on mounting base 6b. Attitude stabilizing pin 27 and position regulation pin 28 formed on component supply unit 5 are inserted into attitude stabilizing member insertion hole 20a and position regulation part insertion hole 21a, respectively.

Next, a detailed configuration of component supply unit 5 (component supply device) will be described with reference to FIG. 4. Component supply unit 5 is configured to include main body part 5a, connection part 5b positioned on a rear side below main body part 5a, and discharge part 5c positioned on a front upper side of main body part 5a. Feeder controller 29 that controls each part of component supply unit 5 is disposed inside connection part 5b.

On a front surface of connection part 5b, hook 26 with which fixing arm 19 is engaged, air joint 23 to be connected to mounting part air joint 15, first connector 22 to be connected to mounting part connector 14, and pin insertion hole 24 into which mounting part attitude stabilizing pin 16 is inserted are disposed in this order from the upper side to the lower side. Second connector 30 to be connected to third connector 41 (see FIG. 7A) provided in an extension unit (autoloading unit 40) to be described later is disposed on a rear surface of connection part 5b.

In FIG. 4, attitude stabilizing pin 27 to be inserted into attitude stabilizing member insertion hole 20a is disposed on an upper side of a front surface of discharge part 5c. Slider 25 that slides along guide 17 is disposed on a front side of a lower surface of main body part 5a. Position regulation pin 28 to be inserted into position regulation part insertion hole 21a is disposed at a lower portion of a front surface of main body part 5a. Concave-shaped to-be-coupled part 5d with which coupling part 42 (see FIG. 7A) formed in the extension unit (autoloading unit 40) is engaged is formed on a part of a rear surface of main body part 5a and the rear surface of connection part 5b. To-be-coupled part 5d and second connector 30 constitute extension unit mounting part 31 to which the extension unit is attached.

Inside main body part 5a, conveyance path 32 for guiding carrier tape T drawn out from component reel 11 and taken into component supply unit 5 is provided. Conveyance path 32 is provided to communicate from insertion port 32a opened in the rear surface of main body part 5a on an upstream side (left side in FIG. 4) in the tape feeding direction in component supply unit 5 to discharge port 32b opened in a lower surface of discharge part 5c on a downstream side (right side in FIG. 4) in the tape feeding direction. Component take-out position P at which a component is taken out by mounting head 9 is provided in the middle of conveyance path 32.

In FIG. 4, a plurality of sprockets 34 rotatably driven by carrier tape conveyance motor 33 disposed in main body part 5a are disposed below and on a downstream side of conveyance path 32 in main body part 5a. In this example, three sprockets 34 for introduction, conveyance, and carry-out are disposed from the upstream side. Component take-out position P is set between sprockets 34 for conveyance and for carry-out.

Cover tape peel-off part 35 including a pair of rollers is disposed between sprockets 34 for introduction and for conveyance and above conveyance path 32. Cover tape storage part 36 is formed inside main body part 5a and upstream of cover tape peel-off part 35. On conveyance path 32, tape detection sensor 37 that detects carrier tape T inserted into conveyance path 32 is disposed upstream of sprocket 34 for introduction. A detection result obtained by tape detection sensor 37 is transmitted to feeder controller 29. Carrier tape conveyance motor 33 and cover tape peel-off part 35 are controlled by feeder controller 29.

Figure 5A:
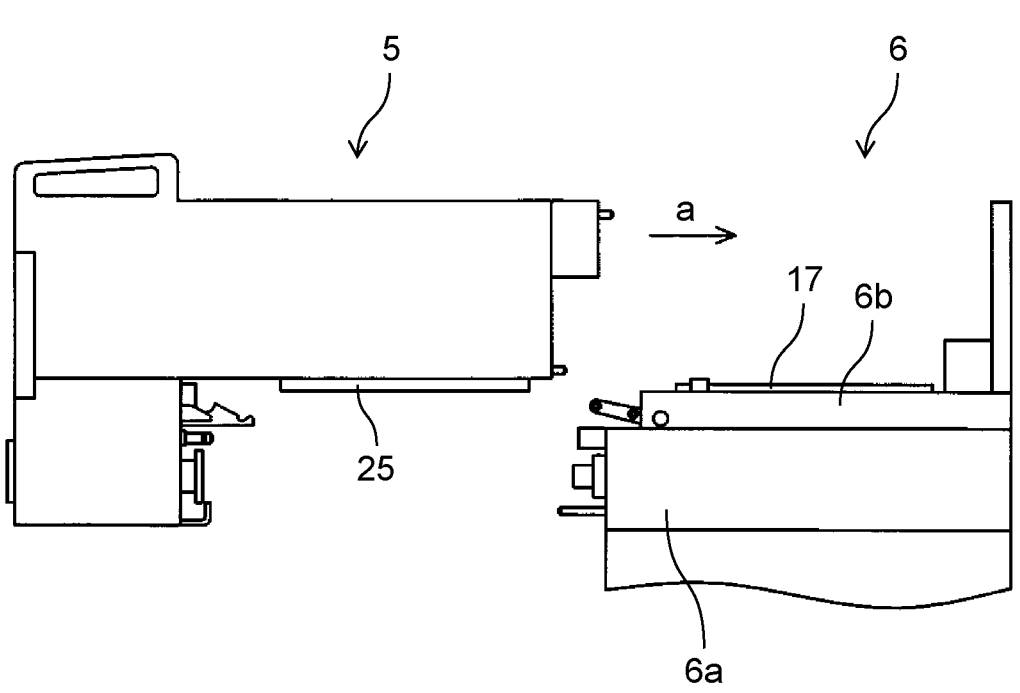
FIG. 5A is a view for explaining a step of mounting the component supply unit (component supply device) on the component supply part according to the embodiment of the present disclosure.
Figure 5B:
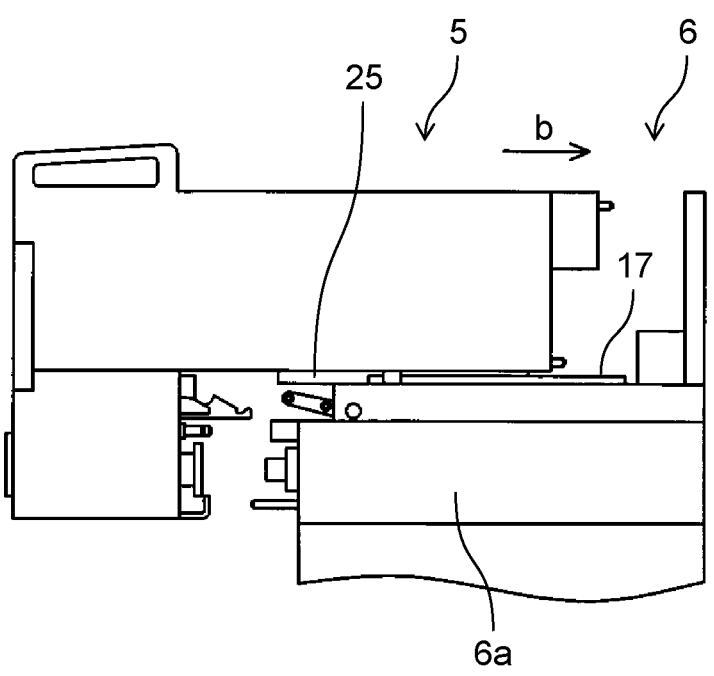
FIG. 5B is a view for explaining a step of mounting the component supply unit (component supply device) on the component supply part according to the embodiment of the present disclosure.

Next, description will be made of a step of mounting component supply unit 5 on component supply unit mounting part 6a (component supply part C) of carriage 6 with reference to FIGS. 5A, 5B, and 6. First, slider 25 of component supply unit 5 is adjusted to a height of guide 17 of mounting base 6b, and component supply unit 5 is brought near to component supply unit mounting part 6a from behind carriage 6 (arrow a in FIG. 5A). Further, component supply unit 5 is moved to the front side of component supply unit mounting part 6a while slider 25 is slid along guide 17 (arrow b in FIG. 5B).

Figure 6:
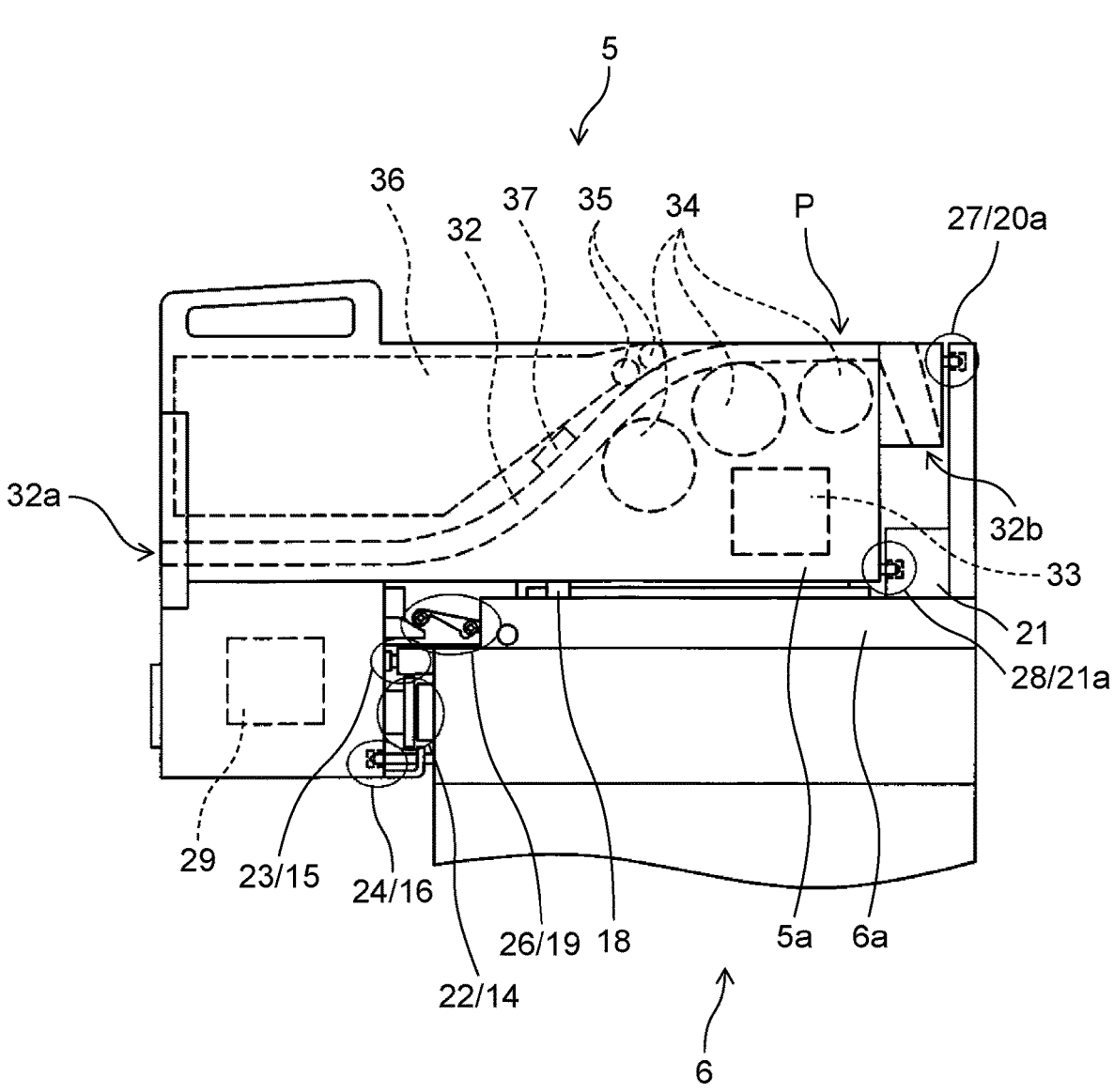
FIG. 6 is a view for explaining a state in which the component supply unit (component supply device) is mounted on the component supply part according to the embodiment of the present disclosure.

In FIG. 6, attitude stabilizing pin 27 is inserted into attitude stabilizing member insertion hole 20a, position regulation pin 28 is inserted into position regulation part insertion hole 21a, and mounting part attitude stabilizing pin 16 is inserted into pin insertion hole 24 in a state where the front surface of main body part 5a of component supply unit 5 abuts on the rear surface of second position regulation part 21. Further, fixing arm 19 is engaged with hook 26 to complete mounting of component supply unit 5 on component supply unit mounting part 6a. At this time, mounting part air joint 15 and air joint 23 are connected, and mounting part connector 14 and first connector 22 are connected.

While being mounted on component supply unit mounting part 6a, component supply unit 5 has a position in the height direction (Z direction) determined as a result of abutting of slider 25 on first position regulation part 18. A position of component supply unit 5 in a mounting direction of component supply unit mounting part 6a (Y direction in a state where carriage 6 is mounted to component mounting device main body part 2) is determined as a result of abutting of main body part 5a on second position regulation part 21. Component supply unit 5 has displacement (vibration) about an axis in the mounting direction suppressed as a result of insertion of attitude stabilizing pin 27 into attitude stabilizing member insertion hole 20a, and insertion of mounting part attitude stabilizing pin 16 into pin insertion hole 24.

In FIGS. 2 and 6, when carriage 6 on which component supply unit 5 is mounted is attached to component mounting device main body part 2, power source part 12 of component mounting device 1 is connected to component supply unit 5 via mounting part connector 14 and first connector 22. As a result, power is supplied from power source part 12 to component supply unit 5. In addition, mounting controller 13 of component mounting device 1 is connected to feeder controller 29 of component supply unit 5 via mounting part connector 14 and first connector 22. This enables transmission and reception of various commands and information between mounting controller 13 and feeder controller 29. In addition, air can be supplied from component mounting device main body part 2 to component supply unit 5 via mounting part air joint 15 and air joint 23.

Next, the conveyance of carrier tape T in component supply unit 5 will be described with reference to FIGS. 2 and 6. When a distal end portion of carrier tape T inserted into conveyance path 32 from insertion port 32a is detected by tape detection sensor 37, feeder controller 29 drives carrier tape conveyance motor 33 to rotate the plurality of sprockets 34. As a result, inserted carrier tape T is fed to component take-out position P by sprockets 34 for introduction and for conveyance.

While the distal end portion of carrier tape T is transferred from sprocket 34 for introduction onto sprocket 34 for conveyance, a cover tape adhered to an upper surface of carrier tape T is peeled off by cover tape peel-off part 35. The peeled cover tape is collected in cover tape storage part 36. Carrier tape T from which the component has been taken out at component take-out position P is pushed out from discharge port 32b to the outside by sprocket 34 for carry-out. Used carrier tape T from which the component is taken out and which has been pushed out from discharge port 32b is collected by a used carrier tape collection part (not illustrated) installed in carriage 6.

In FIG. 2, in component supply unit 5 in a state where the extension unit (autoloading unit 40) is not attached to extension unit mounting part 31 (hereinafter, it is simply referred to as "normal feeder"), when a remainder of carrier tape T being supplied becomes short (when the number of remaining components becomes small), component replenishing work (splicing) of jointing a distal end of subsequent carrier tape T (hereinafter, it is simply referred to as a "succeeding tape T2") to a rear end of preceding carrier tape T (hereinafter, it is simply referred to as "preceding tape T1") is performed using a splicing tape.

Figure 7A:
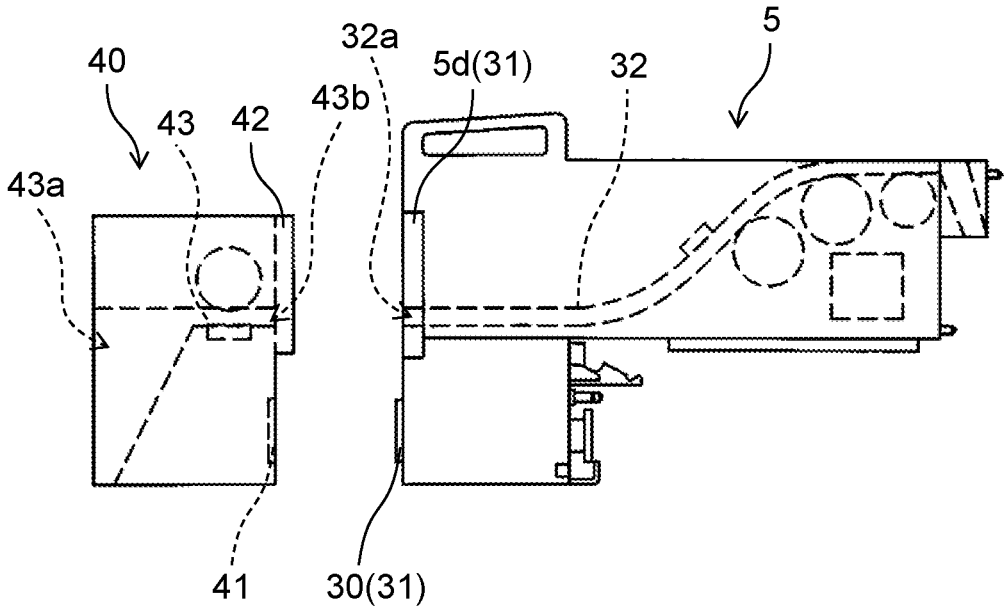
FIG. 7A is a view for explaining a step of attaching an autoloading unit to the component supply unit (component supply device) according to the embodiment of the present disclosure.

Next, with reference to FIGS. 7A and 7B, an extension unit to be used while being attached to component supply unit 5 will be described. Here, autoloading unit 40 as the extension unit will be described as an example. In FIG. 7A, third connector 41 to be connected to second connector 30 of component supply unit 5 is disposed on a lower side of a front surface of autoloading unit 40. On an upper side of the front surface of autoloading unit 40, convex coupling part 42 that engages with to-be-coupled part 5d of component supply unit 5 is formed.

In other words, to-be-coupled part 5d is a fixing part that fixes the attached extension unit to component supply unit 5 (component supply device). Note that coupling part 42 and to-be-coupled part 5d are not limited to a concave shape and a convex shape as long as the extension unit can be fixed to component supply unit 5. Extension conveyance path 43 that guides carrier tape T drawn out from component reel 11 and taken into autoloading unit 40 is provided inside autoloading unit 40. Extension conveyance path 43 is provided to communicate from extension insertion port 43a opened in a rear surface of autoloading unit 40 to extension discharge port 43b opened in the front surface.

Figure 7B:
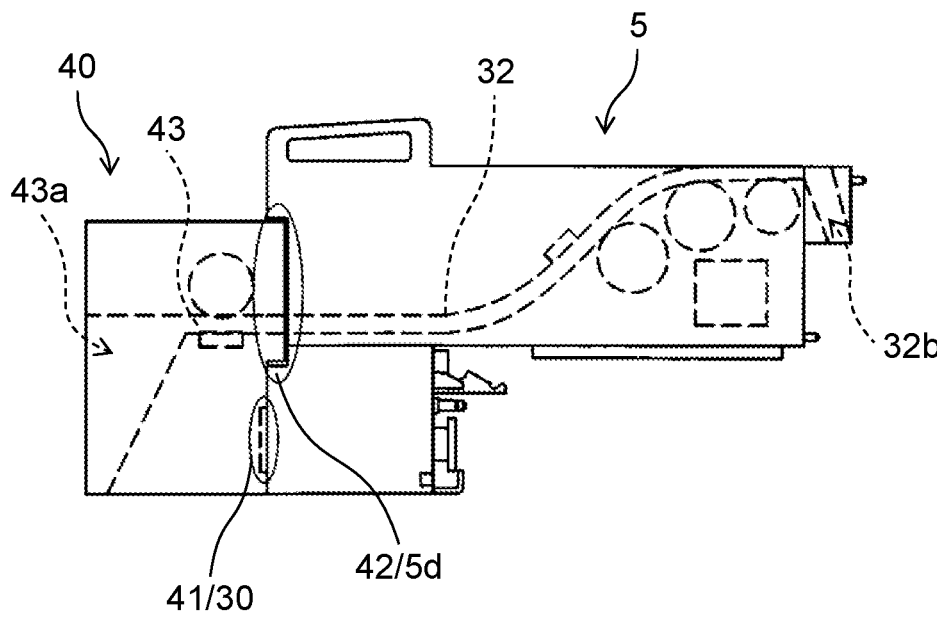
FIG. 7B is a view for explaining a step of attaching the autoloading unit to the component supply unit (component supply device) according to the embodiment of the present disclosure.

In FIG. 7B, when autoloading unit 40 is attached from the rear of component supply unit 5 such that coupling part 42 engages with to-be-coupled part 5d of component supply unit 5, second connector 30 and third connector 41 are connected. In other words, coupling part 42 and third connector 41 are coupled to extension unit mounting part 31 (to-be-coupled part 5d, second connector 30) of component supply unit 5. In this state, extension conveyance path 43 of autoloading unit 40 is coupled to conveyance path 32 of component supply unit 5, so that a traveling path of carrier tape T communicates from extension insertion port 43a to discharge port 32b.

Figure 8:
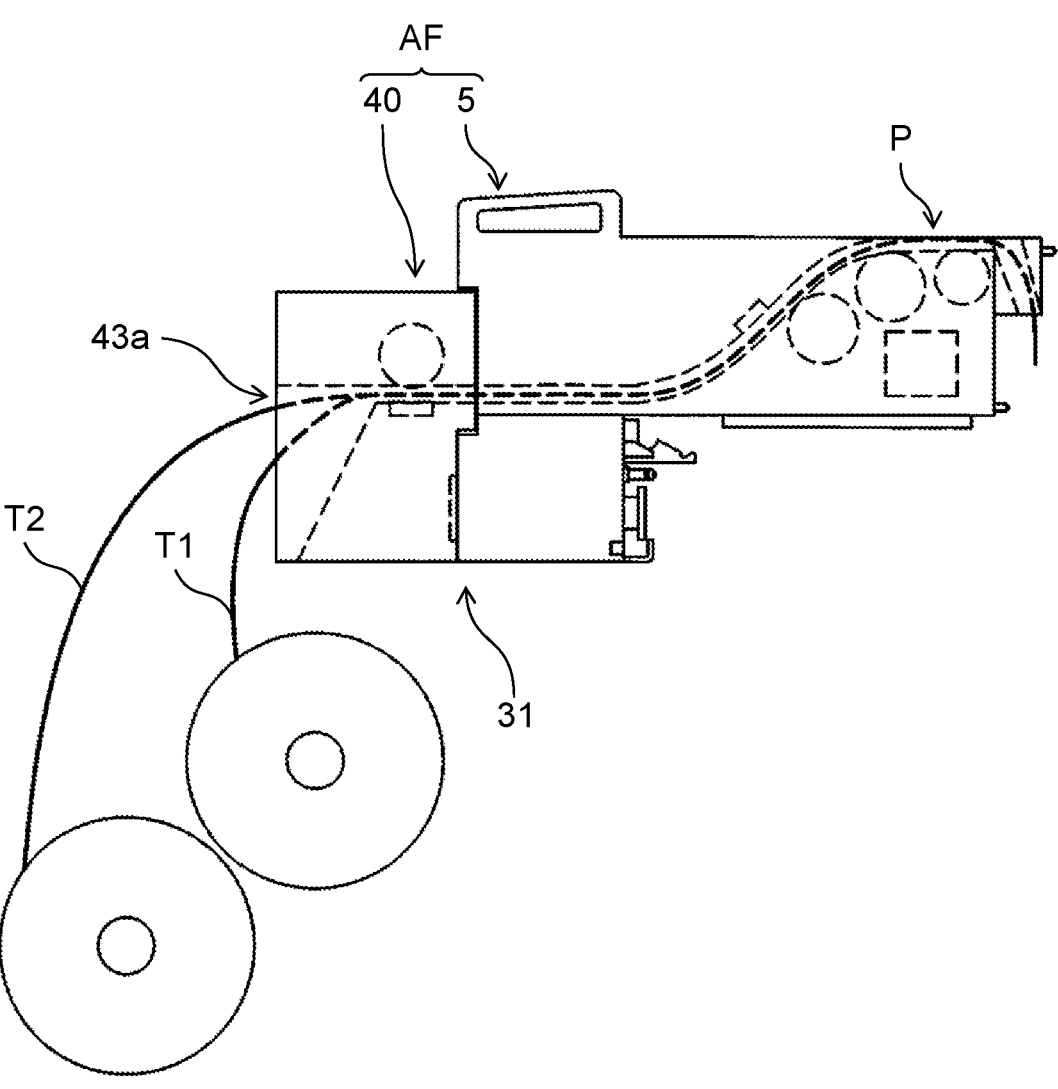
FIG. 8 is a view for explaining a state in which the autoloading unit is attached to the component supply unit (component supply device) to set a second carrier tape according to the embodiment of the present disclosure.

Next, functions of component supply unit 5 in which autoloading unit 40 is attached to extension unit mounting part 31 (hereinafter, simply referred to as "autoloading feeder AF") will be described with reference to FIG. 8. In autoloading feeder AF, succeeding tape T2 for component replenishing can be attached from extension insertion port 43a in a state where a component is supplied from preceding tape T1 to component take-out position P. When preceding tape T1 runs out of a component, autoloading feeder AF to which succeeding tape T2 is attached automatically loads succeeding tape T2 instead of preceding tape T1 toward component take-out position P.

Next, a configuration of tape replacement mechanism 44 installed inside autoloading unit 40 will be described with reference to FIG. 9. Tape replacement mechanism 44 includes extension sprocket 45, motor 46 that rotationally drives extension sprocket 45, block 47, and lever 48. Extension sprocket 45 is disposed above extension conveyance path 43, and has a function of feeding carrier tape T inserted into extension conveyance path 43 in the tape feeding direction. When autoloading unit 40 is attached to component supply unit 5, motor 46 is connected to feeder controller 29 via third connector 41 and second connector 30, and is controlled by feeder controller 29.

Unidirectional clutch 49 is disposed at a drive shaft of extension sprocket 45 rotated by motor 46. While allowing extension sprocket 45 to rotate in a direction (arrow c) in which extension sprocket 45 rotates when carrier tape T inserted from extension insertion port 43a moves in the tape feeding direction, unidirectional clutch 49 prevents extension sprocket from rotating in an opposite direction (arrow d). As a result, it is possible to prevent carrier tape T inserted from extension insertion port 43a from falling off from extension insertion port 43a.

Figure 9:
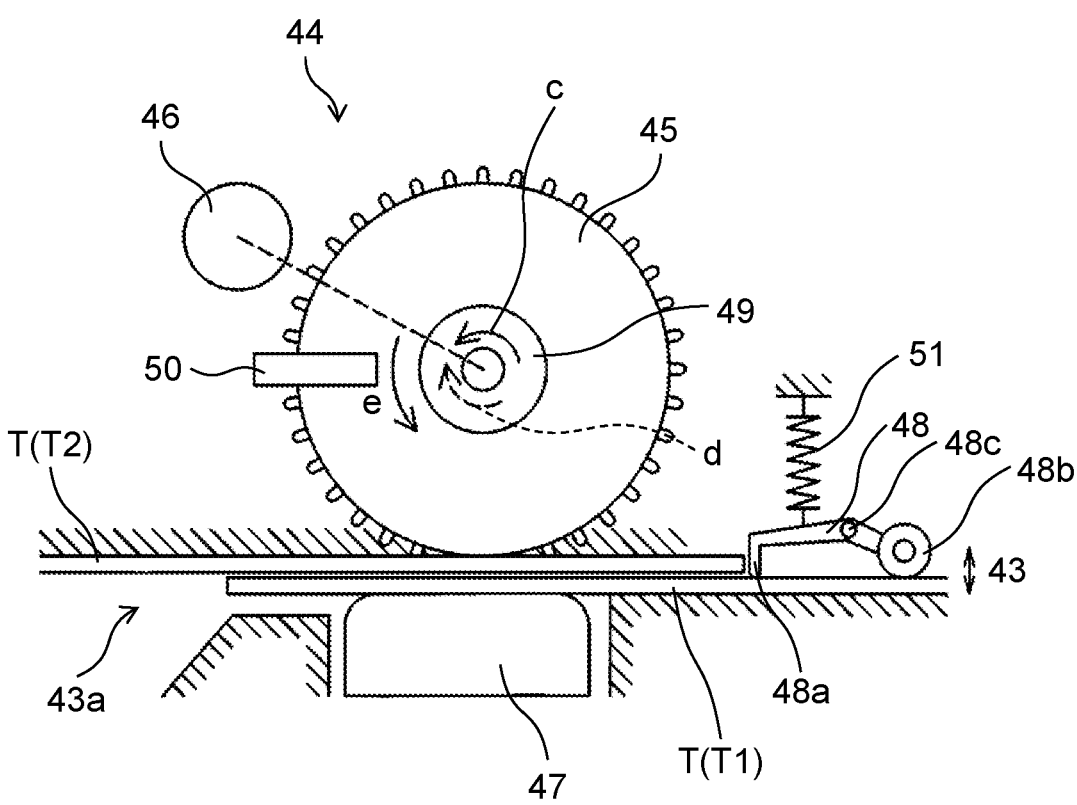
FIG. 9 is an explanatory view of a configuration of the autoloading unit attached to the component supply unit (component supply device) according to the embodiment of the present disclosure.

In FIG. 9, sensor 50 that detects rotation of extension sprocket 45 is disposed in tape replacement mechanism 44.

Sensor 50 detects mounting of carrier tape T by detecting rotation (arrow e) of extension sprocket 45 when carrier tape T is inserted from extension insertion port 43*a*. When autoloading unit 40 is attached to component supply unit 5, sensor 50 is connected to feeder controller 29 via third connector 41 and second connector 30, and a detection result obtained by sensor 50 is transmitted to feeder controller 29.

Block 47 is disposed below extension sprocket 45 with extension conveyance path 43 interposed therebetween. Bock 47 is biased toward extension sprocket 45 by an elastic body such as a spring (not illustrated), and has a function of pressing carrier tape T inserted into extension conveyance path 43 against extension sprocket 45.

In FIG. 9, lever 48 is disposed in extension conveyance path 43 on the downstream side of extension sprocket 45 and block 47 in the tape feeding direction. Lever 48 includes stopper 48*a* at an upstream end portion and roller 48*b* at a downstream end portion, and swings about support shaft 48*c* extending in a direction orthogonal to the tape feeding direction in the horizontal plane as a rotation axis. Elastic member 51 such as a spring is connected to an upper surface of lever 48 between stopper 48*a* and support shaft 48*c*. Lever 48 is biased by elastic member 51 in a direction in which stopper 48*a* side is raised upward.

In FIG. 9, succeeding tape T2 for component replenishing is inserted into autoloading unit 40 in addition to preceding tape T1 that supplies a component. In lever 48, roller 48*b* is raised by preceding tape T1 against a biasing force of elastic member 51, so that stopper 48*a* on the opposite side is lowered downward. Succeeding tape T2 has the distal end portion abutting on stopper 48*a* at a blocking position located downward to stop (stand by).

Figure 10A:
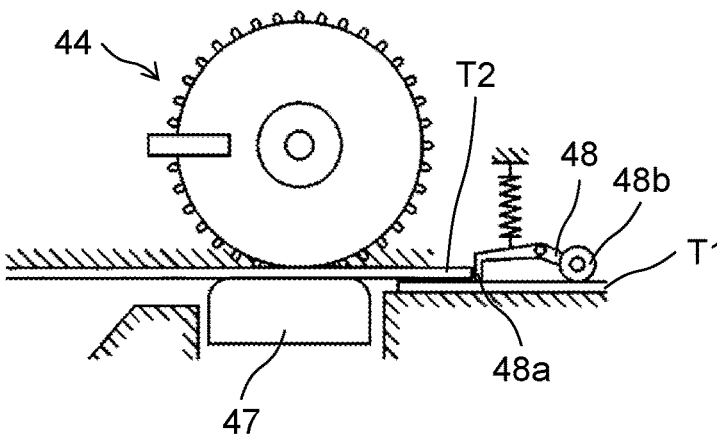
FIG. 10A is a view for explaining a step of replacing a carrier tape in the autoloading unit attached to the component supply unit (component supply device) according to the embodiment of the present disclosure.

Next, tape replacement processing of replacing preceding tape T1 with succeeding tape T2 as carrier tape T for supplying a component by tape replacement mechanism 44 will be described with reference to FIGS. 10A to 10D. FIG. 10A shows a state in which supply of a component from preceding tape T1 proceeds from the state shown in FIG. 9, and the rear end portion of preceding tape T1 has moved to the downstream side of block 47. In FIG. 10A, preceding tape T1 raises roller 48*b* of lever 48, and succeeding tape T2 is stopped by stopper 48*a* at the blocking position.

Figure 10B:
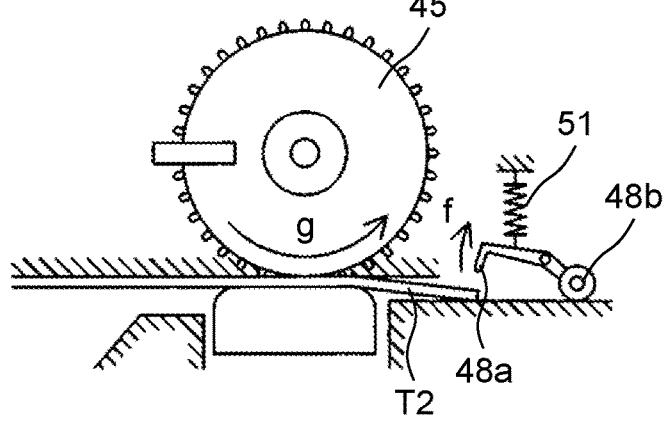
FIG. 10B is a view for explaining a step of replacing the carrier tape in the autoloading unit attached to the component supply unit (component supply device) according to the embodiment of the present disclosure.

FIG. 10B illustrates a state in which the rear end portion of preceding tape T1 has passed through roller 48*b*. When preceding tape T1 passes through, roller 48*b* is lowered by a biasing force of elastic member 51, and stopper 48*a* is raised to an allowable position where entry of succeeding tape T2 on standby is allowed (arrow f). Thereafter, when motor 46 operates according to a command from feeder controller 29, extension sprocket 45 rotates (arrow g), and component supply unit 5 is replenished with succeeding tape T2. In other words, succeeding tape T2 is automatically supplied (automatically loaded) to component supply unit 5 according to the command from the feeder controller 29.

Figure 10C:
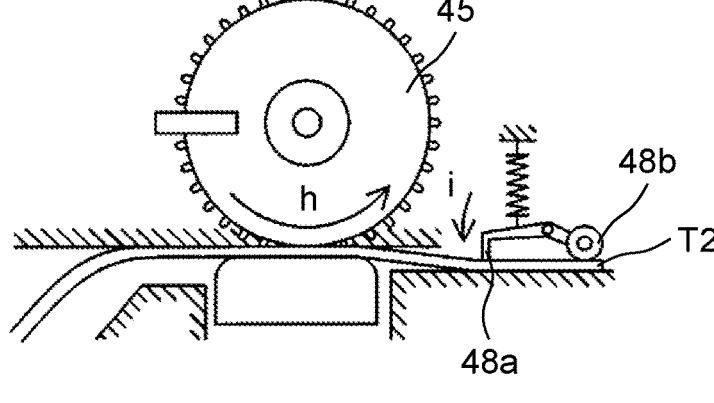
FIG. 10C is a view for explaining a step of replacing the carrier tape in the autoloading unit attached to the component supply unit (component supply device) according to the embodiment of the present disclosure.
Figure 10D:
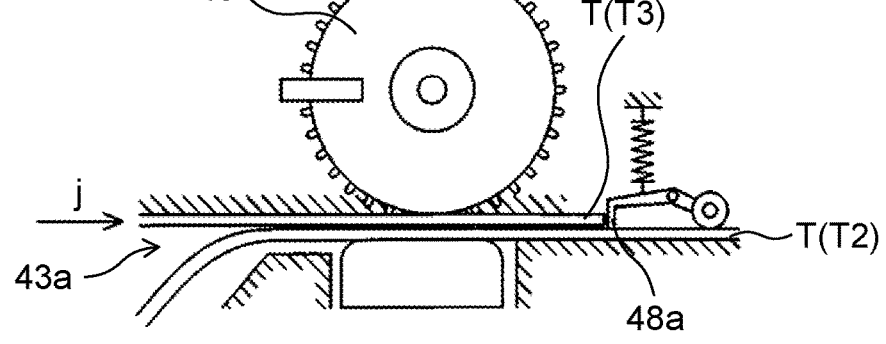
FIG. 10D is a view for explaining a step of replacing the carrier tape in the autoloading unit attached to the component supply unit (component supply device) according to the embodiment of the present disclosure.

In FIG. 10C, when extension sprocket 45 rotates (arrow h), succeeding tape T2 moves downstream, and succeeding tape T2 raises roller 48*b*, stopper 48*a* moves to the blocking position (arrow i). In FIG. 10D, when an operator inserts next carrier tape T3 from extension insertion port 43*a* (arrow j), next carrier tape T3 enters between extension sprocket 45 and previous carrier tape T (succeeding tape T2), and abuts on stopper 48*a* at the blocking position to stop. As described above, autoloading unit 40 which is an extension unit is an automatic loading unit which automatically loads new carrier tape T (succeeding tape T2) into component supply unit 5.

Next, a configuration of a control system of component mounting device 1 will be described with reference to FIG. 11. Substrate conveyance part 3, component mounting part 10, notification part 61, touch panel 62, and mounting storage part 63 are connected to mounting controller 13 provided in component mounting device 1. Component supply unit 5 mounted on component supply part C (component supply unit mounting part 6*a*) is connected to mounting controller 13 via first connector 22 and mounting part connector 14. Mounting controller 13 includes unit controller 64, configuration information acquisition part 65, stockout determination part 66, and feeder information acquisition part 67.

Mounting controller 13 transmits and receives various types of information to and from information management part 68 such as a server that manages a production line including component mounting device 1 via communication network 69. Mounting storage part 63 is a storage device, and stores configuration information 63*a*, feeder information 63*b*, and the like. Notification part 61 is an indicator lamp, a buzzer, or the like, and notifies a warning that component supply unit 5 runs out of stock, an error that the extension unit attached to component supply unit 5 is inappropriate, or the like by lighting a lamp, a warning sound, or the like. Touch panel 62 displays various types of information on its display part, and an operator inputs data or operates component mounting device 1 using an operation button or the like displayed on the display part.

Figure 11:
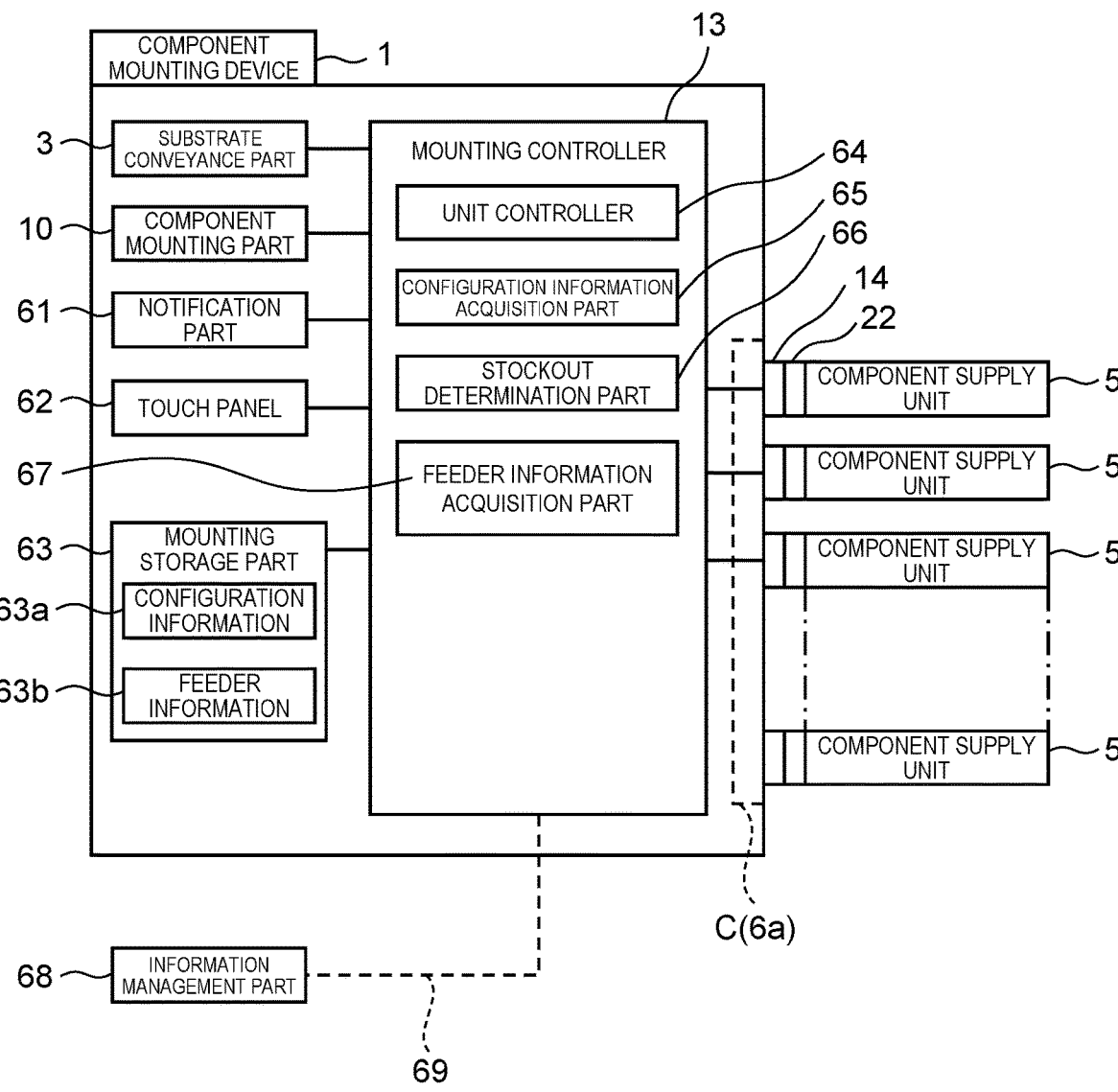
FIG. 11 is a block diagram illustrating a configuration of the component mounting device according to the embodiment of the present disclosure.

In FIG. 11, configuration information acquisition part 65 communicates with the plurality of component supply units 5 mounted on component supply part C to acquire configuration information of each of component supply units 5. Alternatively, configuration information acquisition part 65 communicates with information management part 68 to acquire the configuration information of the plurality of component supply units 5 mounted on component supply part C. Configuration information acquisition part 65 causes mounting storage part 63 to store acquired configuration information 63*a*.

Feeder information acquisition part 67 communicates with the plurality of component supply units 5 mounted on component supply part C to acquire feeder information including a type of component supply unit 5. Alternatively, feeder information acquisition part 67 communicates with information management part 68 to acquire the feeder information of component supply unit 5 mounted on component supply part C. Feeder information acquisition part 67 causes mounting storage part 63 to store acquired feeder information 63*b*.

In FIG. 11, stockout determination part 66 counts the number of residual components stored in carrier tape T that supplies a component based on the number of initial components stored in carrier tape T (preceding tape T1) that supplies a component from component supply unit 5 mounted on component supply part C, the number of components that have been supplied by component supply unit 5, and the like. Based on the number of residual components, stockout determination part 66 determines whether or not there has occurred component stockout in which the number of residual components of carrier tape T attached to component supply unit 5 mounted on component supply part C becomes 0.

Unit controller 64 controls component supply unit 5 mounted on component supply part C based on configuration information 63*a* or feeder information 63*b* stored in mounting storage part 63. Specifically, unit controller 64 controls, based on configuration information 63*a* or feeder information 63*b*, component supply unit 5 holding the carrier tape determined to have stockout by stockout determination part 66 to execute component replenishing processing to be described later.

Next, a configuration of a control system of component supply unit 5 (component supply device) will be described with reference to FIG. 12. Carrier tape conveyance motor 33, tape detection sensor 37, lamp 71, operation part 72, display part 73, and information storage part 74 are connected to feeder controller 29 provided in component supply unit 5. Feeder controller 29 includes operation program storage part 75 and extension unit identification part 76, and controls the operation of component supply unit 5. In other words, feeder controller 29 is a first controller that controls the operation of the component supply device (component supply unit 5).

Lamp 71 notifies an operation state of component supply unit 5, stockout, and the like by lighting, blinking, or the like. Operation part 72 is configured with a button or the like, and accepts operation on component supply unit 5 performed by an operator. Display part 73 is a liquid crystal display plate, a 7-segment light emitting diode (LED), or the like, and displays the operation state and the like of component supply unit 5 with characters. Information storage part 74 is a storage device, and stores feeder information including a unique number for specifying component supply unit 5, and the like, component information including a component name supplied by component supply unit 5, a component identification number, the number of residual components, and the like, and presence or absence of succeeding tape T2 when autoloading unit 40 is attached.

Figure 12:
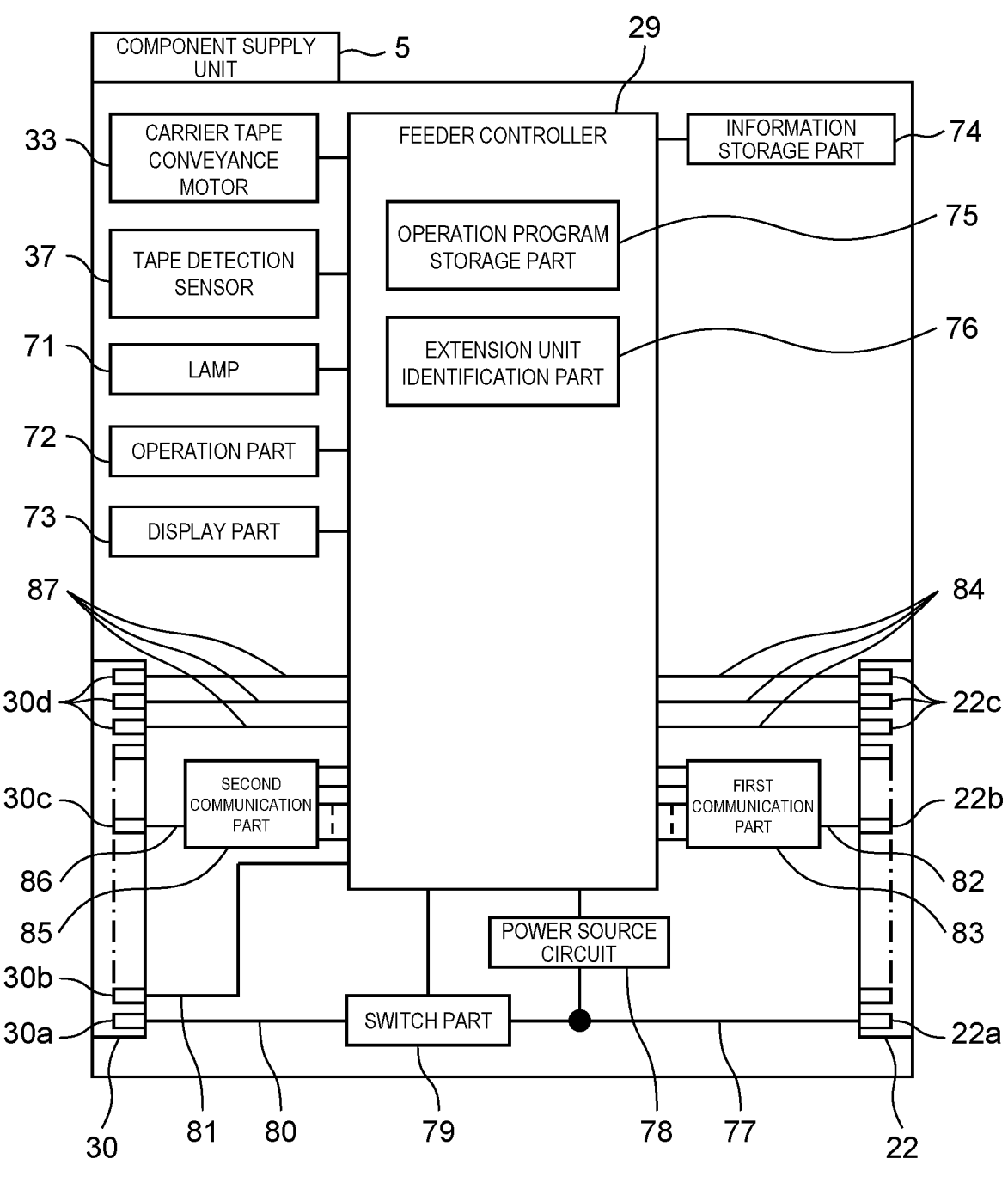
FIG. 12 is a block diagram illustrating a configuration of the component supply unit (component supply device) according to the embodiment of the present disclosure.

In FIG. 12, first connector 22 to be attached to mounting part connector 14 of component supply part C is provided with a plurality of terminals electrically connected to terminals of mounting part connectors 14 in a predetermined arrangement. First power line 77 disposed in component supply unit 5 is connected to power terminal 22*a* of first connector 22. When first connector 22 is attached to mounting part connector 14, first power line 77 is connected to power source part 12 provided in component mounting device 1 via power terminal 22*a*, so that power is supplied from power source part 12 to first power line 77. First power line 77 is connected to power source circuit 78 provided in component supply unit 5. Power source circuit 78 supplies power to each part provided in component supply unit 5.

The other end of first communication line 82 having one end connected to first communication part 83 disposed in component supply unit 5 is connected to communication terminal 22*b* of first connector 22. First communication part 83 converts a serial signal transmitted from mounting controller 13 via first communication line 82 into a parallel signal and transmits the parallel signal to feeder controller 29. In addition, first communication part 83 converts a parallel signal transmitted from feeder controller 29 into a serial signal and transmits the serial signal to mounting controller 13. The other ends of a plurality of first control lines 84 whose one ends are connected to feeder controller 29 are connected to a plurality of control terminals 22*c* of first connector 22. Feeder controller 29 and mounting controller 13 transmit and receive control signals via the plurality of first control lines 84.

Next, a configuration of a control system of autoloading unit 40 which is an extension unit and a configuration of a portion, of a control system of component supply unit 5 (component supply device), connected to the extension unit, will be described with reference to FIGS. 12 and 13. Third connector 41 of autoloading unit 40 and second connector

30 of component supply unit 5 are provided with a plurality of terminals electrically connected to each other in a predetermined arrangement. Second power line 80 disposed in component supply unit 5 is connected to power terminal 30*a* of second connector 30.

Second power line 80 is connected to first power line 77 via switch part 79 controlled by feeder controller 29. When feeder controller 29 turns on switch part 79, power is supplied from first power line 77 to second power line 80, and when switch part 79 is turned off, power supply from first power line 77 to second power line 80 is cut off. In addition, switch part 79 has a function of detecting a current supplied from first power line 77 to second power line 80, and cuts off supply of power to second power line 80 when detecting an overcurrent. Detection terminal 30*b* of second connector 30 is connected to feeder controller 29 via extension unit detection line 81.

Figure 13:
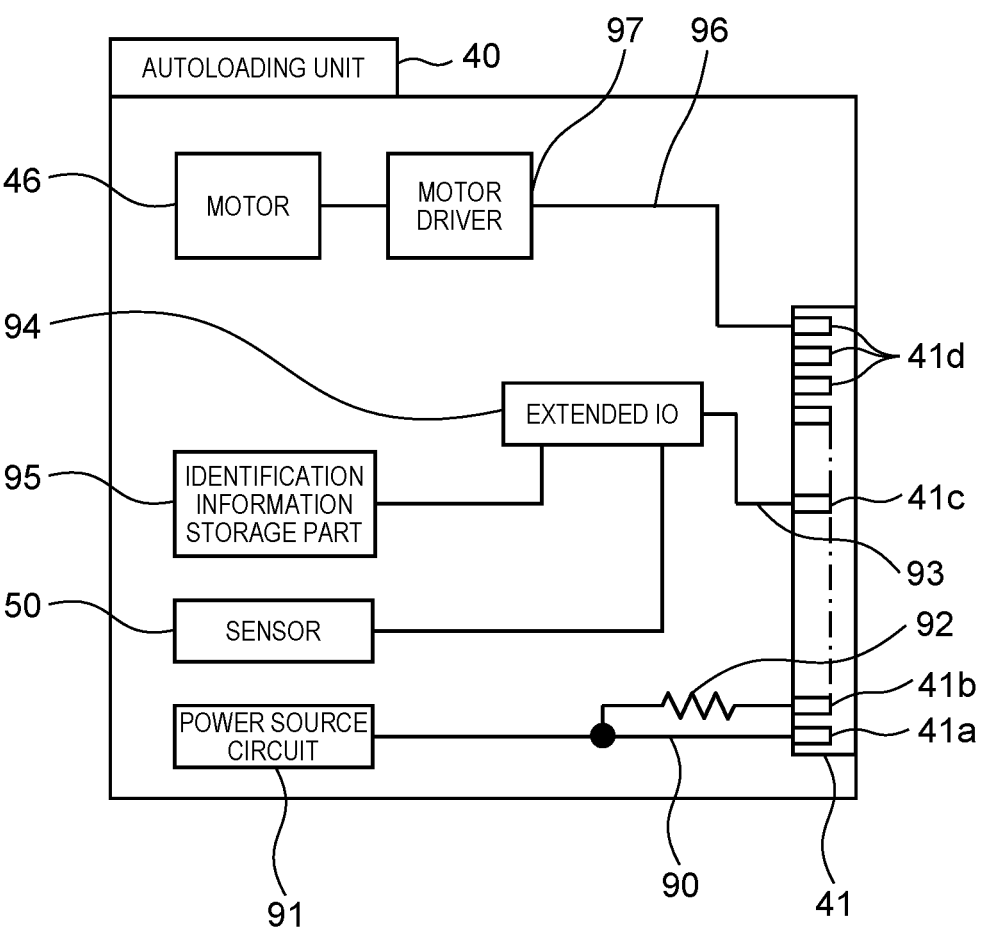
FIG. 13 is a block diagram illustrating the configuration of the autoloading unit attached to the component supply unit (component supply device) according to the embodiment of the present disclosure.

In FIGS. 12 and 13, to power terminal 41*a* of third connector 41 of autoloading unit 40, the other end of third power line 90 having one end connected to power source circuit 91 disposed in autoloading unit 40 is connected. Power source circuit 91 supplies power to each part provided in autoloading unit 40. Third power line 90 is connected to detection terminal 41*b* of third connector 41 via resistor 92 having a high resistance value and disposed in autoloading unit 40. In other words, a state of the power supplied to third power line 90 can be detected by measuring a voltage of detection terminal 41*b* of third connector 41.

Here, a method of detecting presence or absence of autoloading unit 40 (extension unit) by feeder controller 29 (first controller) will be described with reference to FIGS. 12 and 13. When feeder controller 29 turns on switch part 79 in a state where autoloading unit 40 is attached to component supply unit 5 mounted on component supply part C, power is supplied from power terminal 30*a* of second connector 30 of component supply unit 5 to autoloading unit 40. Then, a voltage of third power line 90 is output from detection terminal 41*b* of third connector 41. In this case, detection terminal 30*b* of second connector 30 has the same voltage as third power line 90, i.e., the same (substantially the same) voltage as first power line 77.

When feeder controller 29 turns off switch part 79 in a state where autoloading unit 40 is attached to component supply unit 5 mounted on component supply part C, power supply to autoloading unit 40 is cut off. In this case, detection terminal 30*b* of second connector 30 is brought to an open state. Even if feeder controller 29 turns on switch part 79 in a state where autoloading unit 40 is not attached to component supply unit 5 mounted on component supply part C, detection terminal 30*b* of second connector 30 remains in the open state. In a case where extension unit detection line 81 is pulled down, a voltage of extension unit detection line 81 becomes 0 when detection terminal 30*b* is opened.

In FIGS. 12 and 13, feeder controller 29 measures a voltage of detection terminal 30*b* of second connector 30 via extension unit detection line 81. In a case where the voltage of detection terminal 30*b* is the same (substantially the same) as the voltage of first power line 77 when feeder controller 29 turns on switch part 79, feeder controller 29 determines that autoloading unit 40 (extension unit) is attached. On the other hand, in a case where detection terminal 30*b* is in the open state when feeder controller 29 turns on switch part 79, feeder controller 29 determines that autoloading unit 40 is not attached.

As described above, second connector 30 is connected to extension unit detection line 81 for detecting presence or absence of the extension unit (autoloading unit 40). Feeder controller 29 detects presence or absence of the extension unit based on the voltage of extension unit detection line 81 when switch part 79 is turned on or off. In addition, when switch part 79 is turned on, switch part 79 cuts off power to the extension unit upon detecting an overcurrent in power to be supplied to the extension unit. In other words, switch part 79 is a safety circuit that monitors power to be supplied to the extension unit.

In FIGS. 12 and 13, the other end of second communication line 86 having one end connected to second communication part 85 disposed in component supply unit 5 is connected to communication terminal 30c of second connector 30 of component supply unit 5. Second communication part 85 converts a parallel signal transmitted from feeder controller 29 into a serial signal and transmits the serial signal to autoloading unit 40. In addition, second communication part 85 converts a serial signal transmitted from autoloading unit 40 via second communication line 86 into a parallel signal and transmits the parallel signal to feeder controller 29.

The other end of third communication line 93 having one end connected to extension input/output interface (extended IO) 94 disposed in autoloading unit 40 is connected to communication terminal 41c of third connector 41 of autoloading unit 40. Identification information storage part 95 and sensor 50 that detects rotation of extension sprocket 45 are connected to extended IO 94. Identification information storage part 95 is a storage device, and stores information including a unique number for specifying autoloading unit 40, and the like, information for specifying a type of extension unit, and the like.

In FIGS. 12 and 13, extended IO 94 converts the information stored in identification information storage part 95 and a detection result obtained by sensor 50 into a serial signal and transmits the serial signal to feeder controller 29 via communication terminal 41c. Extended IO 94 converts a parallel signal transmitted from feeder controller 29 and transmits the converted signal to identification information storage part 95 and sensor 50. Extension unit identification part 76 provided in feeder controller 29 (first controller) acquires information specifying a type of extension unit from identification information storage part 95 of autoloading unit 40, and recognizes a type of the extension unit connected to second connector 30.

Operation program storage part 75 stores a plurality of operation programs corresponding to the types of extension units connected to second connector 30. Extension unit identification part 76 acquires an operation program corresponding to a recognized type of the extension unit from operation program storage part 75 to adapt to control conducted by feeder controller 29 (e.g., updating firmware wafer). As described above, feeder controller 29 (first controller) has extension unit identification part 76 that recognizes a type of an extension unit connected to second connector 30 and matches the operation program to the extension unit.

In FIGS. 12 and 13, feeder controller 29 (first controller) notifies component mounting device 1 of the recognition result obtained by extension unit identification part 76 as configuration information 63a or feeder information 63b. Specifically, feeder controller 29 notifies component mounting device 1 of information on at least one of presence or absence of the extension unit, a type of extension unit being attached, and a state of the operation program as the recognition result. Then, configuration information acquisition part 65 acquires at least presence or absence of the extension unit as the configuration information. Feeder information acquisition part 67 acquires a type of feeder (component supply unit 5) specified by the presence or absence of the extension unit.

Recognition of the type of the extension unit by extension unit identification part 76 is executed immediately after feeder controller 29 turns on switch part 79 to start power supply to the extension unit connected to second connector 30. When extension unit identification part 76 cannot recognize a type of extension unit or when the extension unit is not proper one, feeder controller 29 turns off switch part 79 to cut off the power supply. In other words, when extension unit identification part 76 cannot recognize a type of extension unit, switch part 79 (safety circuit) cuts off power to the extension unit. As a result, breakage (failure) of an unknown or improper extension unit connected to second connector 30 can be prevented.

In FIGS. 12 and 13, the other ends of a plurality of second control lines 87 whose one ends are connected to feeder controller 29 are connected to a plurality of control terminals 30d of second connector 30. The other end of third control line 96 having one end connected to motor driver 97 disposed in autoloading unit 40 is connected to one of a plurality of control terminals 41d of third connector 41. Motor driver 97 drives motor 46 that rotationally drives extension sprocket 45. When autoloading unit 40 is attached to second connector 30, feeder controller 29 and motor driver 97 are connected, so that feeder controller 29 controls motor driver 97 via second control line 87 and third control line 96.

As described above, the component supply device (component supply unit 5) includes the first controller (feeder controller 29) that controls operation of the component supply device, first connector 22 that electrically connects the first controller with the second controller (mounting controller 13) of component mounting device 1, and second connector 30 that electrically connects the first controller with the extension unit (autoloading unit 40) attached to the component supply device. Then, second connector 30 is connected to the power line (second power line 80) that supplies power, the control line (second control line 87) for parallel communication, and the communication line (second signal line 86) for serial communication. This enables the component supply device to have a function automatically extended according to an attached extension unit.

Figure 14A:
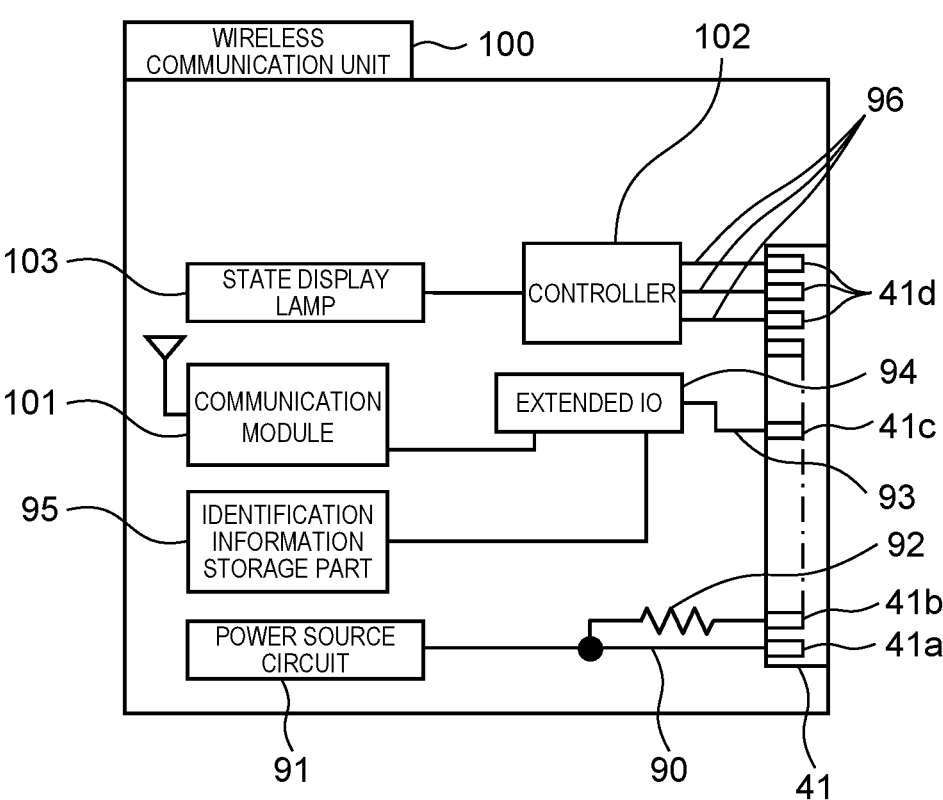
FIG. 14A is a block diagram illustrating a configuration of a wireless communication unit mounted on the component supply unit (component supply device) according to the embodiment of the present disclosure.

Next, a configuration of wireless communication unit 100, which is an extension unit attached to component supply unit 5, will be described with reference to FIG. 14A. Hereinafter, the same parts of the configuration of wireless communication unit 100 as those of autoloading unit 40 will be denoted by the same reference numerals, and detailed description thereof will be omitted. In addition to identification information storage part 95, communication module 101 is connected to extended IO 94 provided in wireless communication unit 100. Communication module 101 is a communication module for wireless communication or a wireless module that communicates with a wireless tag.

Component supply unit 5 to which wireless communication unit 100 is attached can wirelessly transmit information of component supply unit 5 to the outside by communication module 101. Controller 102 is connected to the plurality of third control lines 96. State display lamp 103 is connected to controller 102. When wireless communication unit 100 is attached to component supply unit 5, controller 102 is connected to feeder controller 29. Controller 102 causes state display lamp 103 to blink based on a command transmitted from feeder controller 29.

Figure 14B:
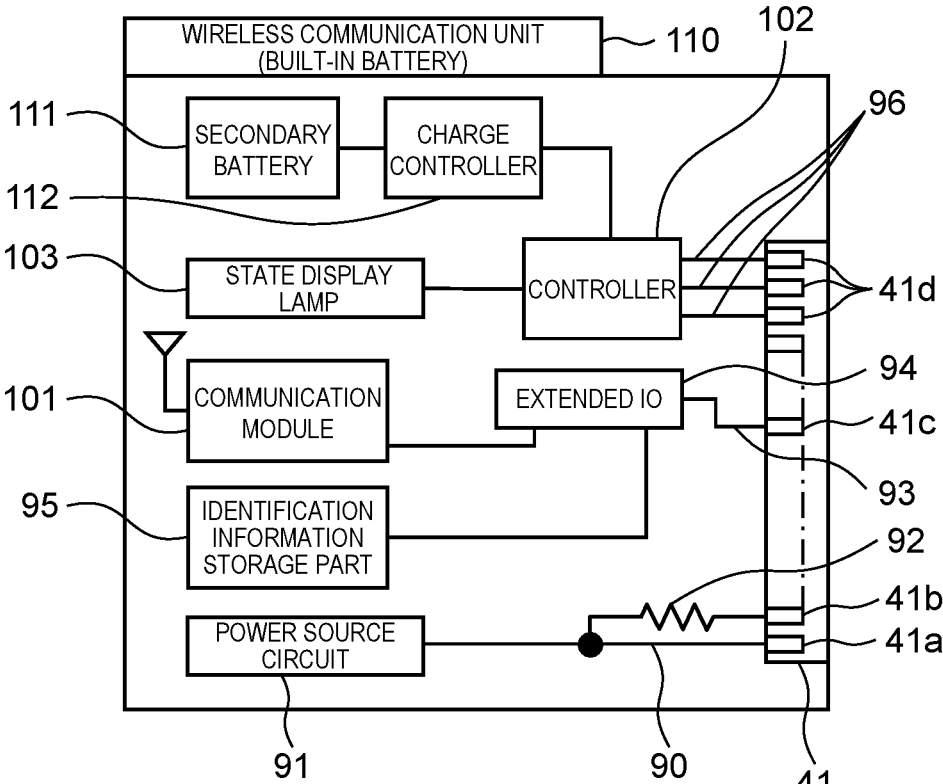
FIG. 14B is a block diagram illustrating a configuration of another wireless communication unit mounted on the component supply unit (component supply device) according to the embodiment of the present disclosure.

Next, a configuration of battery built-in wireless communication unit 110, which is another extension unit attached to component supply unit 5, will be described with reference to FIG. 14B. Hereinafter, the same parts of the configuration of battery built-in wireless communication unit 110 as those of wireless communication unit 100 are denoted by the same reference numerals, and detailed description thereof will be omitted. Battery built-in wireless communication unit 110 includes secondary battery 111 and charge controller 112 that is connected to controller 102 and controls charging of the secondary battery. Charge controller 112 controls charging and discharging of secondary battery 111.

While power is supplied from component supply unit 5, power is supplied from power source circuit 91 to each part of battery built-in wireless communication unit 110, and secondary battery 111 is charged. When the power supply from component supply unit 5 is cut off, power is supplied from secondary battery 111 to each part of battery built-in wireless communication unit 110. Accordingly, even in a state where component supply unit 5 is not connected to an external power source, information of component supply unit 5 can be transmitted by transmitting radio waves from communication module 101 to which power is supplied from secondary battery 111.

Next, following the flow of FIG. 15, description will be made of extension unit identification processing to be executed first when component supply unit 5 is mounted on component supply part C (component supply unit mounting part 6a) and power is supplied from power source part 12 to component supply unit 5. When power is supplied to component supply unit 5, feeder controller 29 turns on switch part 79 (ST1). As a result, power can be supplied from power terminal 30a of second connector 30.

Next, feeder controller 29 measures the voltage of detection terminal 30b of second connector 30 to detect whether or not the extension unit is attached to second connector 30 (ST2: extension unit detection processing step). In other words, feeder controller 29 determines that the extension unit is attached when the voltage of detection terminal 30b is the same as that of first power line 77, and determines that the extension unit is not attached when detection terminal 30b is in the open state. In a case where the extension unit is attached ("present" in ST3), extension unit identification part 76 of feeder controller 29 reads identification information identifying a type of extension unit from identification information storage part 95 of the extension unit (ST4: identification information acquisition step).

Figure 15:
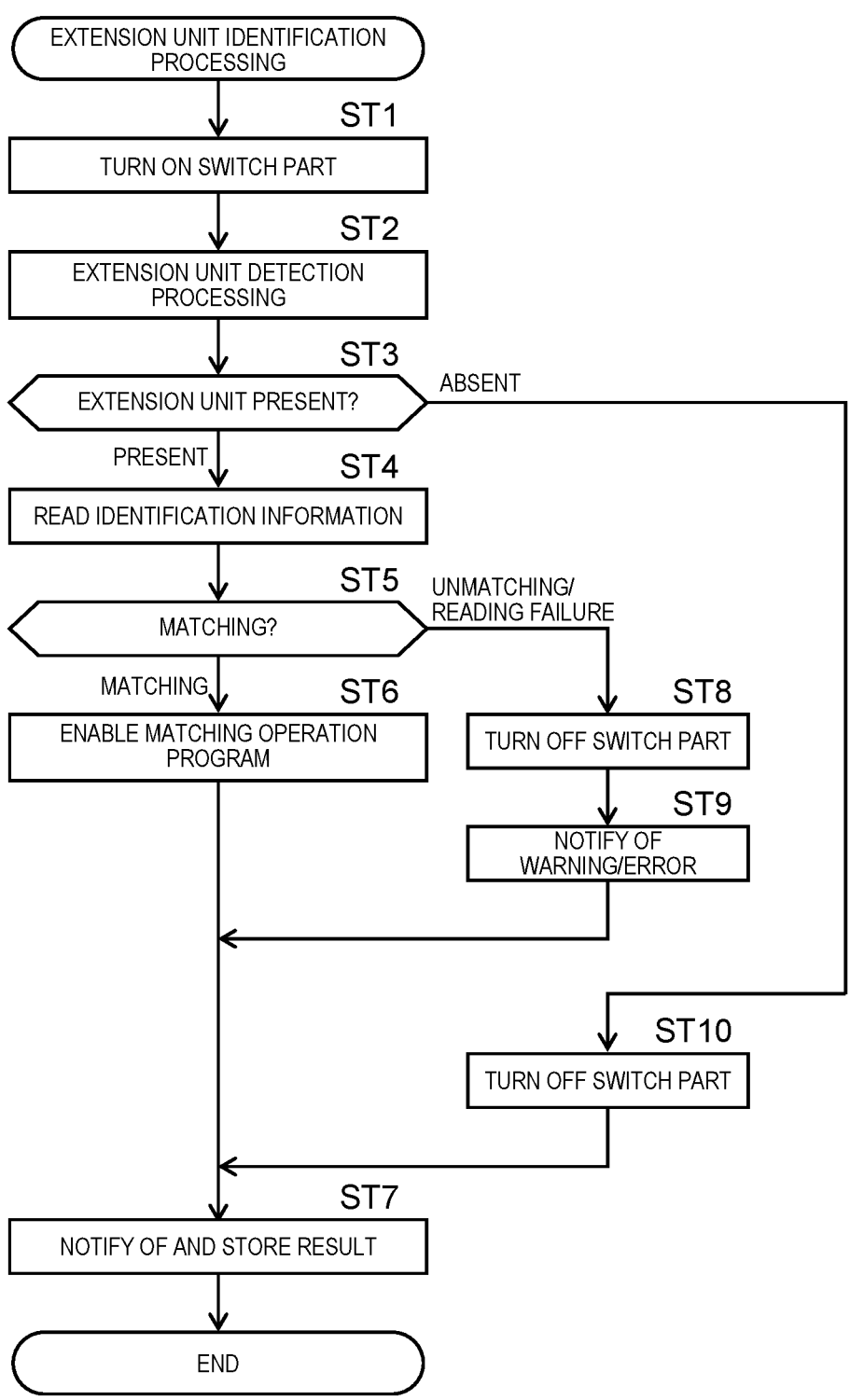
FIG. 15 is a flowchart of extension unit identification processing in the component mounting device according to the embodiment of the present disclosure.

In FIG. 15, in a case where the read identification information is information indicating a proper extension unit ("matching" in ST5), extension unit identification part 76 enables a matched operation program stored in operation program storage part 75 (ST6: operation program enabling step). For example, in a case where an operation program corresponding to the extension unit indicated by the read identification information is stored in operation program storage part 75, extension unit identification part 76 determines that the extension unit is a proper extension unit.

This enables feeder controller 29 to execute control corresponding to the attached extension unit. In other words, component supply unit 5 is changed to a feeder of a different type by attaching an extension unit for extending the function of component supply unit 5. For example, when autoloading unit 40 is attached, component supply unit 5 becomes autoloading feeder AF. When the extension unit is not attached, component supply unit 5 becomes the normal feeder.

Next, feeder controller 29 notifies mounting controller 13 of component mounting device 1 of the result of the extension unit identification processing (configuration information 63a, feeder information 63b) (ST7: result notification step). The notification result is stored in mounting storage part 63 of component mounting device 1. For example, the result of the extension unit identification processing is transmitted as information (configuration information 63a) that allows component mounting device 1 to recognize the configuration of component supply unit 5, such as presence or absence of the extension unit and identification information of the attached extension unit. Alternatively, the result of the extension unit identification processing is transmitted as information (feeder information 63b) for specifying a type of component supply unit 5, such as autoloading feeder AF and the normal feeder.

In FIG. 15, when the read identification information is not information indicating a proper extension unit or when the identification information cannot be read ("unmatching/reading failure" in ST5), feeder controller 29 turns off switch part 79 to cut off the power supply to the extension unit (ST8). Next, feeder controller 29 causes at least either lamp 71 or display part 73 to notify warning/error (ST9). Next, the result notification step (ST7) is executed, and feeder controller 29 notifies mounting controller 13 that the extension unit attached to component supply unit 5 is not proper or that recognition of the extension unit has failed.

When the extension unit is not attached ("absent" in ST3), feeder controller 29 turns off switch part 79 to cut off the power supply to second power terminal 30a (ST10). Next, the result notification step (ST7) is executed, and feeder controller 29 notifies mounting controller 13 that the extension unit is not attached to component supply unit 5.

As described above, the information (configuration information 63a, feeder information 63b) notified in the result notification step (ST7) is acquired by mounting controller 13 (configuration information acquisition part 65, feeder information acquisition part 67) and stored in mounting storage part 63. Specifically, a component mounting method of taking out a component from component supply part 5 mounted on component supply part C and mounting the component on substrate B in component mounting device 1 includes a step of acquiring configuration information 63a of component supply unit 5 mounted on component supply part C (configuration information acquisition step).

Alternatively, the component mounting method includes a step of acquiring feeder information 63b including a type of component supply unit 5 mounted on component supply part C (feeder information acquisition step). Then, component mounting device 1 controls component supply unit 5 based on the acquired configuration information 63a or feeder information 63b (component supply unit control step), and mounting head 9 takes out the component from component supply unit 5 and mounts the component on substrate B (component mounting step).

Next, stockout monitoring processing executed in component mounting device 1 during the component mounting work will be described following the flow of FIG. 16. During the component mounting work, stockout determination part 66 of mounting controller 13 monitors occurrence of component stockout based on the number of residual components of component supply unit 5 mounted on component supply part C that supplies the component (ST11: component stockout monitoring step). In other words, in the component stockout monitoring step (ST11), stockout of components of carrier tape T is determined.

When no stockout has occurred (No in ST12), the component stockout monitoring step (ST11) is continuously executed. When stockout has occurred (Yes in ST12), unit controller 64 determines a type of component supply unit 5 in which stockout has occurred (ST13: feeder determination step (determination of type of component supply unit 5)). Specifically, unit controller 64 identifies, from configuration information 63a or feeder information 63b, whether or not component supply unit 5 holding carrier tape T that has run out of a component has autoloading unit 40 (automatic loading unit).

Figure 16:
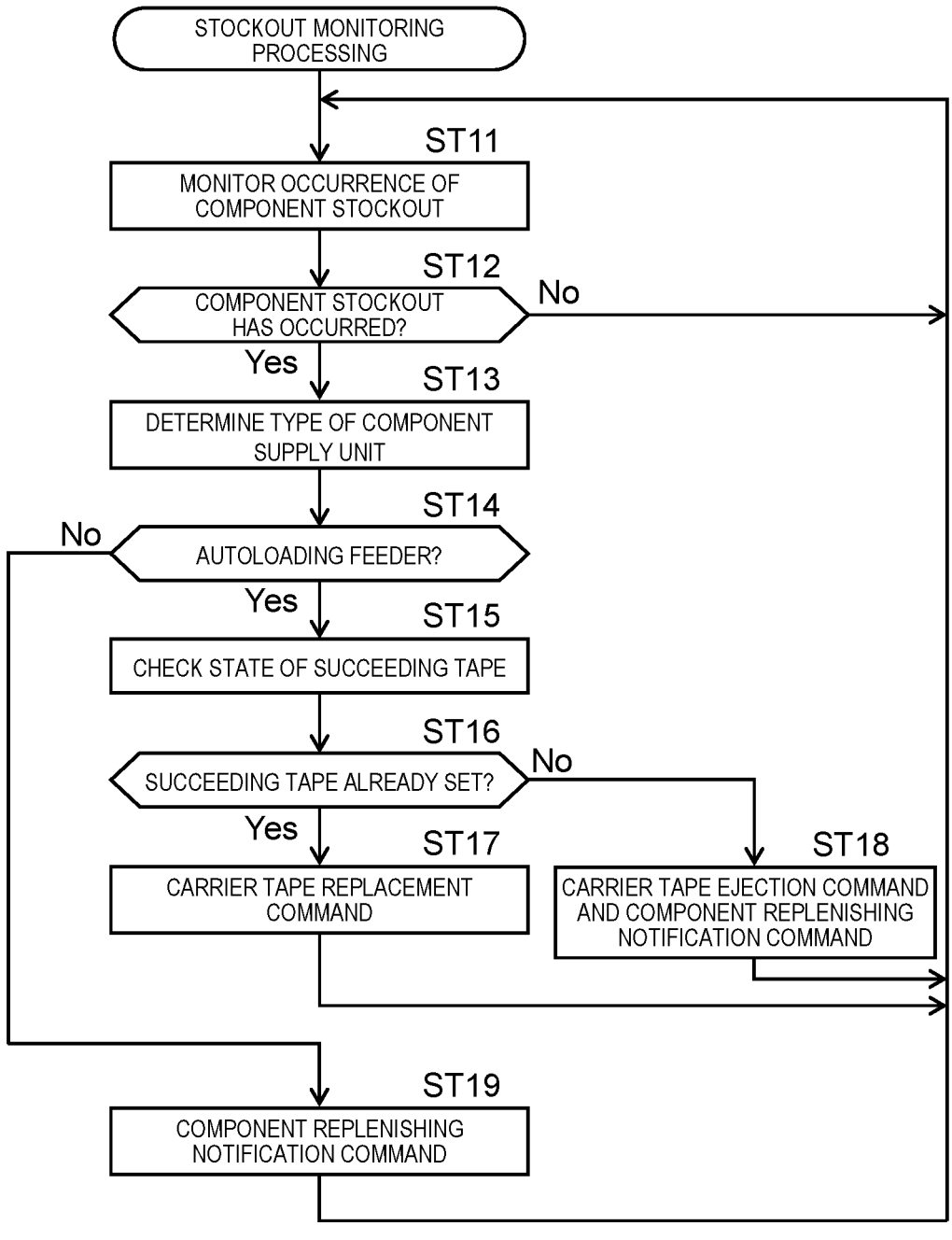
FIG. 16 is a flowchart of stockout monitoring processing in the component mounting device according to the embodiment of the present disclosure.

In FIG. 16, in a case where component supply unit 5 in which stockout has occurred is autoloading feeder AF (Yes in ST14), unit controller 64 checks an attachment state of succeeding tape T2 (ST15). In a case where succeeding tape T2 has been set (Yes in ST16), unit controller 64 transmits a carrier tape replacement command to component supply unit 5 (ST17).

Specifically, when identifying that component supply unit 5 that stockout has occurred has autoloading unit 40 (automatic loading unit), unit controller 64 outputs a command to eject carrier tape T (preceding tape T1) that has run out of a component and automatically load new carrier tape T (succeeding tape T2) to component supply unit 5. Thereafter, unit controller 64 returns to the stockout monitoring step (ST11). While the replacement of the carrier tape is being executed in autoloading feeder AF, mounting controller 13 suspends take-out of components from autoloading feeder AF (alternatively, take-out of a component from other component supply unit 5 is executed first).

In FIG. 16, in a case where succeeding tape T2 is not set (No in ST16), unit controller 64 transmits a carrier tape ejection command to component supply unit 5 to eject preceding tape T1, and transmits a component replenishing notification command to notification part 61 or touch panel 62 to notify component replenishing (ST18). Thereafter, unit controller 64 returns to the stockout monitoring step (ST11).

In a case where component supply unit 5 in which stockout has occurred is the normal feeder (No in ST14), the component replenishing notification command to notify component replenishing is transmitted to notification part 61 or touch panel 62 (ST19). Specifically, when identifying that component supply unit 5 that stockout has occurred does not have autoloading unit 40 (automatic loading unit), unit controller 64 outputs the command (component replenishing notification command) for notifying stockout. Thereafter, unit controller 64 returns to the stockout monitoring step (ST11).

As described above, when identifying that component supply unit 5 holding carrier tape T that has run out of a component has the automatic loading unit (autoloading unit 40) by configuration information 63a or feeder information 63b (Yes in ST14), unit controller 64 outputs, to component supply unit 5, a command to eject carrier tape T that has run out of a component (preceding tape T1) and automatically load new carrier tape T (succeeding tape T2) (ST17), and when identifying that the component supply unit does not have the automatic loading unit (No in ST14), unit controller outputs the command to notify stockout of a component (ST19). This enables the component replenishing processing of appropriately replenishing carrier tape T to be executed according to the attached extension unit.

Figure 17:
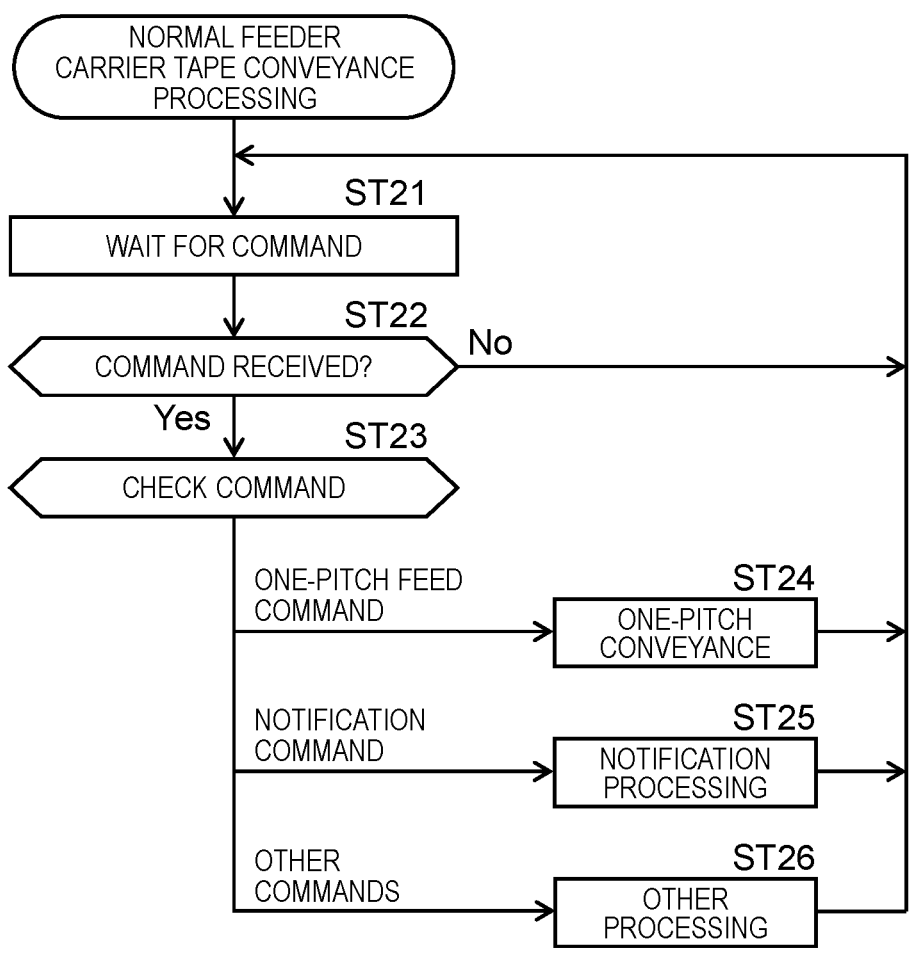
FIG. 17 is a flowchart of carrier tape conveyance processing in a normal feeder according to the embodiment of the present disclosure.

Next, carrier tape conveyance processing executed by the normal feeder, which is component supply unit 5 to which no extension unit is attached, according to a command from unit controller 64 will be described following the flow of FIG. 17. During the component mounting work, feeder controller 29 waits for a command from unit controller 64 (ST21: command waiting step). When no command is received (No in ST22), the command waiting step (ST21) is continuously executed. When receiving the command (Yes in ST22), feeder controller 29 controls each part of component supply unit 5 according to the received command (ST23 to ST26).

Specifically, upon receiving "one-pitch feed command", feeder controller 29 controls carrier tape conveyance motor 33 to convey carrier tape T by one pitch (ST24: one-pitch conveyance step). When receiving the "notification command", feeder controller 29 controls lamp 71 and display part 73 to notify the commanded contents (ST25: notification processing step). Feeder controller 29 also causes various types of processing to be executed in response to other commands (ST26). When causing the received command to be executed, feeder controller 29 returns to the command waiting step (ST21).

Figure 18:
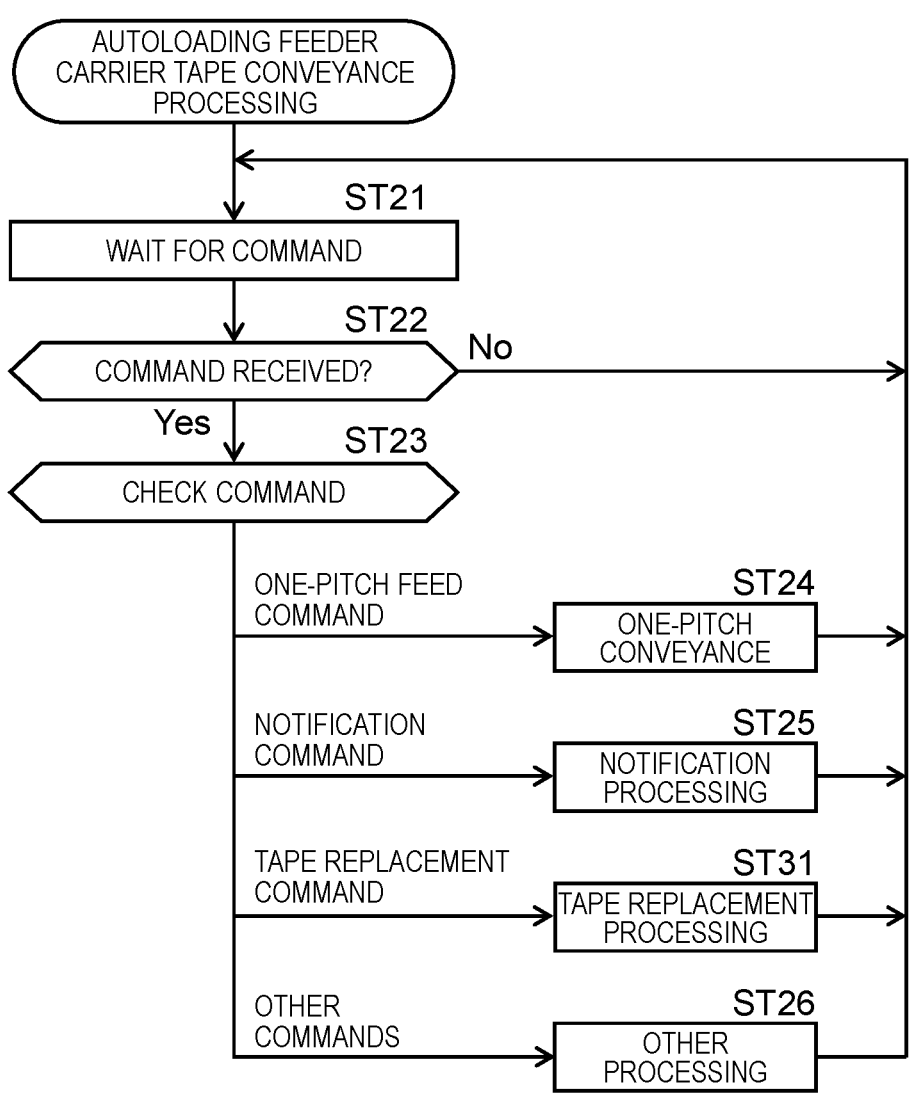
FIG. 18 is a flowchart of the carrier tape conveyance processing in an autoloading feeder according to the embodiment of the present disclosure.

Next, following the flow of FIG. 18, description will be made of the carrier tape conveyance processing executed by autoloading feeder AF, which is component supply unit 5 to which autoloading unit 40 is attached, according to a command from unit controller 64. The same steps as those of the carrier tape conveyance processing of the normal feeder are denoted by the same reference numerals, and detailed description thereof will be omitted. In a case where the command is not received during the component mounting work (No in ST22), the command waiting step (ST21) is continuously executed. When receiving the command (Yes in ST22), feeder controller 29 controls each part of component supply unit 5 according to the received command (ST23 to ST26, ST31).

Specifically, when the "one-pitch feed command" is received, the one-pitch conveyance step (ST24) is executed. When the "notification command" is received, the notification processing step (ST25) is executed. Upon receiving the "tape replacement command", feeder controller 29 controls carrier tape conveyance motor 33 and motor driver 97 of autoloading unit 40 to perform the tape replacement processing (the component replenishing processing) of ejecting preceding tape T1 and replacing preceding tape T1 with succeeding tape T2 (ST31: tape replacement processing step). Feeder controller 29 also causes various types of processing to be executed in response to other commands (ST26). When causing the received command to be executed, feeder controller 29 returns to the command waiting step (ST21).

As described above, component mounting device 1 includes: component supply part C on which component supply unit 5 that supplies a component stored in carrier tape T is detachably mounted; configuration information acquisition part 65 that acquires configuration information 63a of component supply unit 5 mounted on component supply part C (alternatively, feeder information acquisition part 67 that acquires feeder information 63b including a type of component supply unit 5 mounted on component supply part C); mounting head 9 that mounts a component supplied from component supply unit 5 onto substrate B; and unit controller 64 that controls component supply unit 5 based on configuration information 63a (alternatively, feeder information 63b). As a result, the component can be mounted on substrate B by a method that automatically matches the configuration of component supply unit 5.

Component supply unit 5 is a component supply device that supplies a component to component mounting device 1 that mounts a component on substrate B, and includes first controller (feeder controller 29) that controls operation of the component supply device; first connector 22 that electrically connects the first controller with the second controller (mounting controller 13) of component mounting device 1; and second connector 30 that electrically connects the first controller with the extension unit (autoloading unit 40) attached to the component supply device. Then, second connector 30 is connected to second power line 80 that supplies power, second control line 87 for parallel communication, and second communication line 86 for serial communication. This enables the component supply device to have a function extended according to an attached extension unit.

INDUSTRIAL APPLICABILITY

The component mounting device and the component mounting method of the present disclosure have an effect that a component can be mounted on a substrate by a method that automatically matches a configuration of the component supply unit, and are useful in the field of mounting a component on a substrate.

REFERENCE MARKS IN THE DRAWINGS

1 component mounting device
5 component supply unit
9 mounting head
40 autoloading unit (extension unit, automatic loading unit)
64 unit controller
65 configuration information acquisition part
66 stockout determination part
67 feeder information acquisition part
B substrate
C component supply part
T carrier tape

What is claimed is:

1. A component mounting device comprising:
a component supply part on which a component supply unit that supplies a component stored in a carrier tape is detachably mounted;
a feeder information acquisition part that acquires feeder information including a type of the component supply unit mounted on the component supply part;
a mounting head that mounts the component supplied from the component supply unit onto a substrate; and
a unit controller that controls the component supply unit based on the feeder information,
wherein the component supply unit is changed to a different type of feeder by attaching an extension unit for extending a function of the component supply unit, and the feeder information acquisition part acquires a type of the feeder specified by presence or absence of the extension unit.

2. The component mounting device according to claim 1, wherein the feeder information acquisition part acquires the feeder information from the component supply unit mounted on the component supply part.

3. The component mounting device according to claim 1, further comprising a stockout determination part that determines stockout of the component in the carrier tape, wherein the unit controller controls the component supply unit holding the carrier tape that has run out of a component based on the feeder information.

4. The component mounting device according to claim 1, wherein the extension unit is an automatic loading unit that automatically loads the carrier tape as a new carrier tape to the component supply unit.

5. The component mounting device according to claim 4, wherein when identifying that the component supply unit holding the carrier tape that has run out of a component has the automatic loading unit by the feeder information, the unit controller outputs, to the component supply unit, a command to eject the carrier tape that has run out of a component and automatically load the carrier tape as a new carrier tape, and when identifying that the component supply unit does not have the automatic loading unit, the unit controller outputs a command to notify of stockout of a component.

6. A component mounting method for mounting a component stored in a carrier tape on a substrate by a component supply part on which a component supply unit that supplies the component is detachably mounted and by a mounting head that takes out the component from the component supply unit to mount the component on a substrate, the component mounting method comprising:
acquiring feeder information including a type of the component supply unit mounted on the component supply part; taking out the component from the component supply unit and mounting the component on the substrate by the mounting head; and
controlling the component supply unit based on the feeder information,
wherein
the component supply unit is changed to a different type of feeder by attaching an extension unit for extending a function of the component supply unit, and
as the feeder information, a type of the feeder specified at least by presence or absence of the extension unit is acquired.

7. The component mounting device according to claim 6, wherein the feeder information is acquired from the component supply unit mounted on the component supply part.

8. The component mounting method according to claim 6, wherein the extension unit is an automatic loading unit that automatically loads a new carrier tape to the component supply unit, the component mounting method further comprising:
determining stockout of the component in the carrier tape;
identifying whether or not the component supply unit holding the carrier tape that has run out of a component has the automatic loading unit from the feeder information;
outputting, to the component supply unit, a command to eject the carrier tape that has run out of a component and automatically load the carrier tape as a new carrier tape when identifying the component supply unit as having the automatic loading unit; and
outputting a command to notify of stockout when identifying the component supply unit as not having the automatic loading unit.

* * * * *